(12) United States Patent
Lee

(10) Patent No.: US 6,221,818 B1
(45) Date of Patent: **\*Apr. 24, 2001**

(54) HYDROXYLAMINE-GALLIC COMPOUND COMPOSITION AND PROCESS

(75) Inventor: Wai Mun Lee, Fremont, CA (US)

(73) Assignee: EKC Technology, Inc., Hayward, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/636,794

(22) Filed: Aug. 11, 2000

Related U.S. Application Data

(63) Continuation of application No. 08/628,060, filed on Apr. 17, 1996, which is a continuation-in-part of application No. 08/078,657, filed on Jun. 21, 1993, now abandoned, which is a continuation-in-part of application No. 07/911,102, filed on Jul. 9, 1992, now Pat. No. 5,334,332, which is a continuation-in-part of application No. 07/610,044, filed on Nov. 5, 1990, now Pat. No. 5,279,771.

(51) Int. Cl.$^7$ .................. C11D 7/26; C11D 7/32
(52) U.S. Cl. ............ 510/176; 510/175; 510/245; 510/255; 510/264; 510/488; 510/499
(58) Field of Search ................... 510/175, 176, 510/245, 255, 264, 488, 499

(56) References Cited

U.S. PATENT DOCUMENTS

| | | | | |
|---|---|---|---|---|
| 5,334,332 | * | 8/1994 | Lee | 252/548 |
| 5,419,779 | * | 5/1995 | Ward | 134/38 |
| 5,672,577 | * | 9/1997 | Lee | 510/175 |
| 5,902,780 | * | 5/1999 | Lee | 510/176 |
| 6,121,217 | * | 9/2000 | Lee | 510/176 |
| 6,140,287 | * | 10/2000 | Lee | 510/175 |

\* cited by examiner

*Primary Examiner*—Gregory Delcotto
(74) *Attorney, Agent, or Firm*—Pennie & Edmonds LLP

(57) ABSTRACT

A hydroxylamine-gallic compound composition comprises a hydroxylamine compound, at least one alcohol amine compound which is miscible with the hydroxylamine compound and a gallic compound. A process for removing photoresist or other polymeric material or a residue from a substrate, such as an integrated circuit semiconductor wafer including titanium metallurgy, in accordance with this invention comprises contacting the substrate with a hydroxylamine compound, an alcohol amine compound which is miscible with the hydroxylamine compound and a gallic compound for a time and at a temperature sufficient to remove the photoresist, other polymeric material or residue from the substrate. Use of a gallic compound in place of catechol in the composition and process reduces attack on titanium metallurgy by, e.g., about three times.

5 Claims, 34 Drawing Sheets

HYDROXYLAMINE-GALLIC COMPOUND COMPOSITION AND PROCESS

ORIGIN OF THE INVENTION

This application is a continuation of application Ser. No. 08/628,060, filed Apr. 17, 1996 allowed, which is a continuation-in-part of application Ser. No. 08/078,657, filed Jun. 21, 1993 abandoned, which is in turn a continuation-in-part of application Ser. No. 07/911,102, filed Jul. 9, 1992, now U.S. Pat. No. 5,334,332, which was a continuation-in-part of application Ser. No. 07/610,044, filed Nov. 5, 1990, now U.S. Pat. No. 5,279,771. The disclosures of those applications are hereby incorporated by reference in this application.

BACKGROUND OF THE INVENTION

1. Field of the Invention

The present invention relates generally to a stripping and cleaning composition and process for removal of polymeric materials and organic, organometallic and metal oxide residues from substrates. More particularly, it relates to such a composition and process for removing polymers, such as photoresist, polyimide, and the like and etching residues after plasma etching processes in the fabrication of integrated circuits and similar processes. Most especially, it relates to such a composition and process which is effective for the removal of these materials while avoiding substantial attack on metal layers employed in integrated circuits, including titanium layers.

2. Description of the Prior Art

As integrated circuit manufacturing has become more complex and the dimensions of circuit elements fabricated on silicon or other semiconductor wafers have become smaller, continued improvement in techniques used to remove photoresist or other polymeric materials and residues formed from such materials has been required. Photoresist or other polymeric materials, such as polyimide, are often subjected to ion implantation, plasma etching, reactive ion etching or ion milling during the fabrication processes to define patterns in the substrate. Additionally, oxygen plasma oxidation is often used for removal of photoresist or other polymeric materials after their use during the fabrication process has been completed. Such high energy processes typically result in the hardening of the photoresist and the formation of organometallic and other residues on sidewalls of the structures being formed in the fabrication process.

A variety of metal and other layers are commonly employed in integrated circuit fabrication, including aluminum, aluminum/silicon/copper, titanium, titanium nitride, titanium/tungsten, tungsten, silicon oxide, polysilicon crystal, and the like. The use of such different layers results in the formation of different organometallic residues in the high energy processes. In addition to being effective for removing photoresist or other polymeric materials or residues, stripping and cleaning compositions should also not attack the different metallurgies used in integrated circuit fabrication.

SUMMARY OF THE INVENTION

Hydroxylamine based compositions, as described in the above-referenced predecessor applications and issued patents, and which are commercially available from EKC Technology, Inc., the assignee of this application, have been proven as very efficient photoresist and etching residue removing formulations in the integrated circuit industry. As a result of a continuous effort to decrease critical dimension size in the integrated circuit industry, such as in the fabrication of sub-micron size devices, etching residue removal and substrate compatibility with chemicals employed in wet processing is becoming more and more critical for obtaining acceptable yield in very large scale integration (VLSI) and ultra large scale integration (ULSI) processes. The composition of such etching residue is generally made up of the etched substrates, underlying substrate, photoresist and etching gases. The substrate compatibility of the wafers with wet chemicals, such as the hydroxylamine compositions, is highly dependent on the processing of the polysilicon, multilevel interconnection dielectric layers and metallization in thin film deposition, etching and post-etch treatment of the wafers, which are often quite different from one fabrication process to another.

In some circumstances, hydroxylamine compositions, such as those containing catechol (1,2-dihydroxybenzene), have produced corrosion on certain metal substrates, such as those including a titanium metal layer, or those including an aluminum layer at high temperatures, i.e. in excess of 65° C. Titanium has become more widely used in semiconductor manufacturing processes. It is employed both as a barrier layer to prevent electromigration of certain atoms and as an antireflector layer on top of other metals. Catechol is considered a hazardous material under applicable Federal regulations (SERA Title III). In a drive to introduce more effective and less toxic wet chemical products for the semiconductor industry, research has been carried out to find a suitable replacement for catechol in hydroxylamine compositions.

Accordingly, it is an object of this invention to provide an improved hydroxylamine based composition and process using such a composition suitable for meeting current semiconductor fabrication requirements.

It is another object of the invention to provide such a composition and process which is suitable for removing photoresist and other polymeric materials and residues from wafers and other substrates including one or more titanium metal layers without substantial attack on such titanium layers.

It is a further object of the invention to provide such a composition and process which contains more healthy and environmentally friendly chemicals.

The attainment of these and related objects may be achieved through use of the hydroxylamine-gallic compound composition and process herein disclosed. A hydroxylamine-gallic compound composition in accordance with this invention comprises a hydroxylamine compound, at least one alcohol amine compound which is miscible with the hydroxylamine compound and a gallic compound. A process for removing photoresist or other polymeric material or a residue from a substrate in accordance with this invention comprises contacting the substrate with a composition that contains a hydroxylamine compound, an alcohol amine compound which is miscible with the hydroxylamine compound and a gallic compound for a time and at a temperature sufficient to remove the photoresist, other polymeric material or residue from the substrate.

In practice, we have found that substitution of a gallic compound in approximately equivalent amounts for catechol gives a photoresist stripping and cleaning or residue removing composition that attacks titanium at least about three times less than the composition containing catechol. At the same time, the gallic compound containing composition gives equivalent performance as a photoresist stripping and cleaning or residue removing composition.

The attainment of the foregoing and related objects, advantages and features of the invention should be more readily apparent to those skilled in the art, after review of the following more detailed description of the invention, taken together with the drawings, in which:

DETAILED DESCRIPTION OF THE INVENTION

Figure 1:
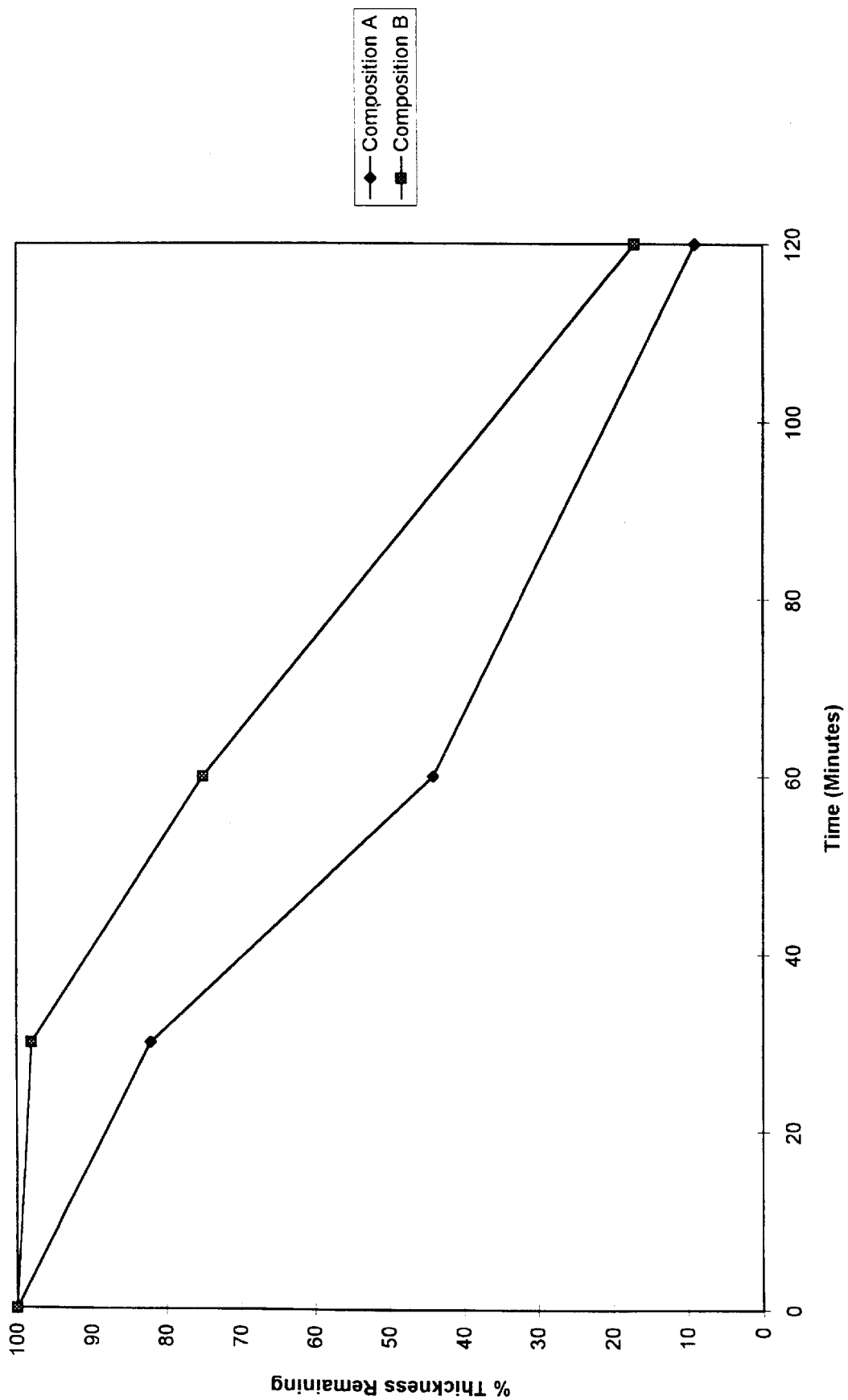
FIGS. 1–4 are graphs showing comparative results on titanium thickness measurements after treatment by another stripping and cleaning and residue removing composition compared with a stripping and cleaning and residue removing composition in accordance with the invention.

The hydroxylamine suitable for use in the invention has the structural formula $H_2N$—OH. Hydroxylamine has properties which, in many ways, lie between those of hydrazine, $H_2N$—$NH_2$, and hydrogen peroxide, HO—OH, as its formula might suggest Hydroxylamine in its pure form is a colorless deliquescent solid having a melting point of 33° C., which explodes on heating and decomposes slowly, evolving nitrous oxide and nitrogen at ambient or room temperature. Hydroxylamine is commercially available in an about 50% by weight in water as an aqueous solution from Nissin Chemical. A proprietary stabilizer is added by Nissin Chemical to the solution to improve its storage stability. In practice, this commercially available form of hydroxylamine is employed in the present invention, and the recitation of amounts refer to the commercially available form. Hydroxylamine is reported by the manufacturer to be incompatible with titanium.

The alcohol amines suitable for use in the present invention are miscible with the hydroxylamine and are preferably water-soluble. Additionally, the alcohol amines useful in the present invention preferably have relatively high boiling points, such as for example, 75° C. or above. Suitable alcohol amines are primary, secondary or tertiary amines and are preferably monoamines, diamines or triamines, and, most preferably, monoamines. The alcohol group of the alcohol amines preferably has from 1 to 6 carbon atoms, and can be based on a linear, branched or cyclic alcohol.

Preferred alcohol amines suitable for use in the present invention can be represented by the chemical formula:

wherein $R_1$ and $R_2$ can be H, $CH_3$, $CH_3CH_2$ or $CH_2CH_2OH$ and $R_3$ is $CH_2CH_2OH$.

Examples of suitable alcohol amines include monoethanolamine, diethanolamine, triethanolamine, tertiarybutyldiethanolamine, isopropanolamine, diisopropanolamine, 2-amino-1-propanol, 3-amino-1-propanol, isobutanolarmine, 2-amino-2-ethoxyethanol (diglycolamine), 2-amino-2-ethoxy-propanol and 1-hydroxy-2-aminobenzene.

The gallic compounds suitable for use in the present invention have the structural formula:

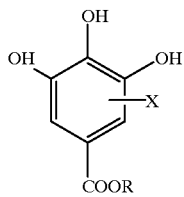

wherein R is hydrogen, an alkyl group or an aryl group containing from 1 to 10 carbon atoms and X is hydrogen, a halogen or an alkyl group containing from 1 to 5 carbon atoms. The preferred gallic compounds are gallic acid, i.e., R and X are hydrogen, or propyl gallate, i.e., R is propyl and X is hydrogen.

The composition desirably contains at least about 5% by weight of hydroxylamine, at least about 10% by weight of at least one alcohol amine and from about 2% to about 30% by weight of the gallic compound. The balance of the composition is made up of water, preferably high purity deionized water, or another suitable polar solvent. The solvents can be used singly or as mixtures. The composition preferably includes from about 5% to about 80% by weight hydroxylamine, from about 10% to about 80% by weight of at least one alcohol amine, from about 5% to about 30% by weight of the gallic compound, with the remaining balance being water or other suitable polar solvent.

While Applicant does not intend to be bound by any particular theory of operation, it is believed that the alcohol amine reacts in situ with the gallic compound in the composition to form either an amide or ammonium phenolate salt.

Suitable examples of polar solvents for the composition, in addition to water, include dimethyl sulfoxide, ethylene glycol, ethylene glycol alkyl ether, diethylene glycol alkyl ether, triethylene glycol alkyl ether, propylene glycol, propylene glycol alkyl ether, dimethyl sulfoxide, N-substituted pyrrolidone, ethylene diamine and ethylenetriamine. Additional polar solvents as known in the art can also be used in the composition of the present invention.

The stripping and cleaning compositions of the present composition are effective in removing a wide range of positive photoresists but are particularly useful in removing photoresists commonly consisting of an orthnaphthoquinone diazide sulfonic acid ester or armide sensitizer with novolak-type binders or resins. Examples of commercially available photoresist compositions which the stripping and cleaning compositions of the present invention effectively remove from a substrate include K.T.I. photoresists 820, 825; Philip A. Hunt Chemical Corp. Waycoat HPR 104, HPR 106, HPR 204 and HPR 206 photoresists; Shipley Company, Inc. photoresists of the AZ-1300 series, AZ-1400 series and AZ-2400 series; and Tokyo Ohka Kogyo Co., Ltd. photoresist OFPR-800.

Further, the stripping and cleaning compositions of the present invention are effective in removing polyimide coatings from substrates even when the polyimide coatings have been subjected to a high temperature cure, including a cure performed at a temperature as high as about 400° C. Examples of commercially available polyimide compositions which the stripping and cleaning compositions of the present invention effectively remove from a substrate includes Ciba Geigy Proimide 293, Asahi G-6246-S, and DuPont PI2545 and PI2555.

Examples of substrates from which the stripping and cleaning compositions of the present invention remove photoresists without attaching the substrates themselves include metal substrates such as aluminum, titanium, tungsten, titanium/tungsten/ aluminum/silicon/copper; and substrates such as silicon oxide, silicon nitride, and gallium/arsenide; and plastic substrates such as polycarbonate.

The stripping and cleaning compositions of the present invention are also effective in removing organometallic and metal oxide residue generated on the substrate of the etching equipment utilized. Examples of commercially available etching equipment include that available from Lam Research, Tegal, Electrotech, Applied Materials, Tokyo Electron, Hitachi and the like.

The method of removing a resist or other material from a substrate using the stripping and cleaning compositions of the present invention involves contacting a substrate having a resist thereon with a stripping and cleaning composition of the present invention for a time and at a temperature sufficient to remove the resist. The time and temperature are determined based on the particular material being removed from a substrate. Generally, the temperature is in the range of from about ambient or room temperature to about 120° C. and the contact time is from about 2 to 60 minutes.

The method of stripping and cleaning a substrate using the stripping and cleaning compositions of the present invention involves contacting a substrate having organometallic and metal oxide residue thereon with a stripping and cleaning composition of the present invention for a time and at a temperature sufficient to remove the residue. The substrate is generally immersed in the stripping and cleaning composition. The time and temperature are determined based on the particular material being removed from a substrate. Generally, the temperature is in the range of from about ambient or room temperature to about 120° C. and the contact time is from about 2 to 60 minutes.

In either case, the substrate may then be rinsed in a polar solvent, such as isopropyl alcohol, followed by a deionized water rinse. The substrate is then mechanically dried, such as with a spin drier, or nitrogen blow dried.

The following represent non-limiting examples and describe the invention further.

Examples of stripping and cleaning compositions according to the present invention suitable for removing a resist from a substrate or for removing resist or other organic residues from a substrate are set forth in Table I below. Compositions A and G are comparative compositions employed to give a frame of reference for the results obtained with the gallic compound containing compositions. Composition F is a prior art composition used for photoresist and residue removal in one of the examples below.

TABLE 1

| Stripping and Cleaning Composition | Commercial Hydroxyl-amine* Wt. % | Alcohol amine Wt. % | Additive Wt. % | Additional Solvent Wt. % |
| --- | --- | --- | --- | --- |
| A | 35% | 60% Mono-ethanolamine | 5% Catechol | |
| B | 35% | 60% Mono-ethanolamine | 5% Gallic acid | |
| C | 30% | 60% Mono-ethanolamine | 10% Gallic acid | |
| D | 30% | 60% Iso-propanolamine | 10% Gallic acid | |
| E | 45% | 45% Digly-colamine | 10% Gallic | |

TABLE 1-continued

| Stripping and Cleaning Composition | Commercial Hydroxyl-amine* Wt. % | Alcohol amine Wt. % | Additive Wt. % | Additional Solvent Wt. % |
| --- | --- | --- | --- | --- |
| F | 0 | 50% Digly-colamine | | 50% N-Ethyl hydroxyl-2-pyroli-done |
| G | 35% | 60% Digly-colamine | 5% Catechol | |
| H | 30% | 60% Digly-colamine | 10% Propyl gallate | |
| I | 30% | 55% Digly-colamine | 10% Gallic acid | 5% Water |
| J | 30% | 55% Digly-colamine | 10% Gallic acid | 5% Dimethyl-sulfoxide |
| K | 30% | 30% Digly-colamine 30% Mono-ethanolamine | 10% Gallic | |
| L | 35% | 60% Iso-propanolamine | 5% Gallic acid | |
| M | 20% | 55% Mono-ethanolamine | 15% Gallic acid | 10% Water |

*Includes approximately 50% by weight water.

EXAMPLE 1

This example shows that substitution of gallic acid for catechol in a hydroxylamine stripping and cleaning composition makes the stripping and cleaning composition much less corrosive to titanium metallurgy on semiconductor wafers than the catechol containing stripping and cleaning composition. The change in dimension of a metallurgy film used in semiconductor manufacturing can be determined by measuring the change of its sheet resistance using the following equation:

Sheet Resistance=Resistivity/Film Thickness.

Experiments were carried out with wafers having a sputtered titanium film of nominal thickness of 3500–4000 Angstroms, as determined by measuring the sheet resistance using a Prometrix Four Point Probe. The wafer samples were immersed in compositions A, B, C, D, G and I listed in Table 1 for 30, 60 and 120 minutes at 75° C. An higher measured sheet resistance results from greater attack of a titanium film.

Figure 2:
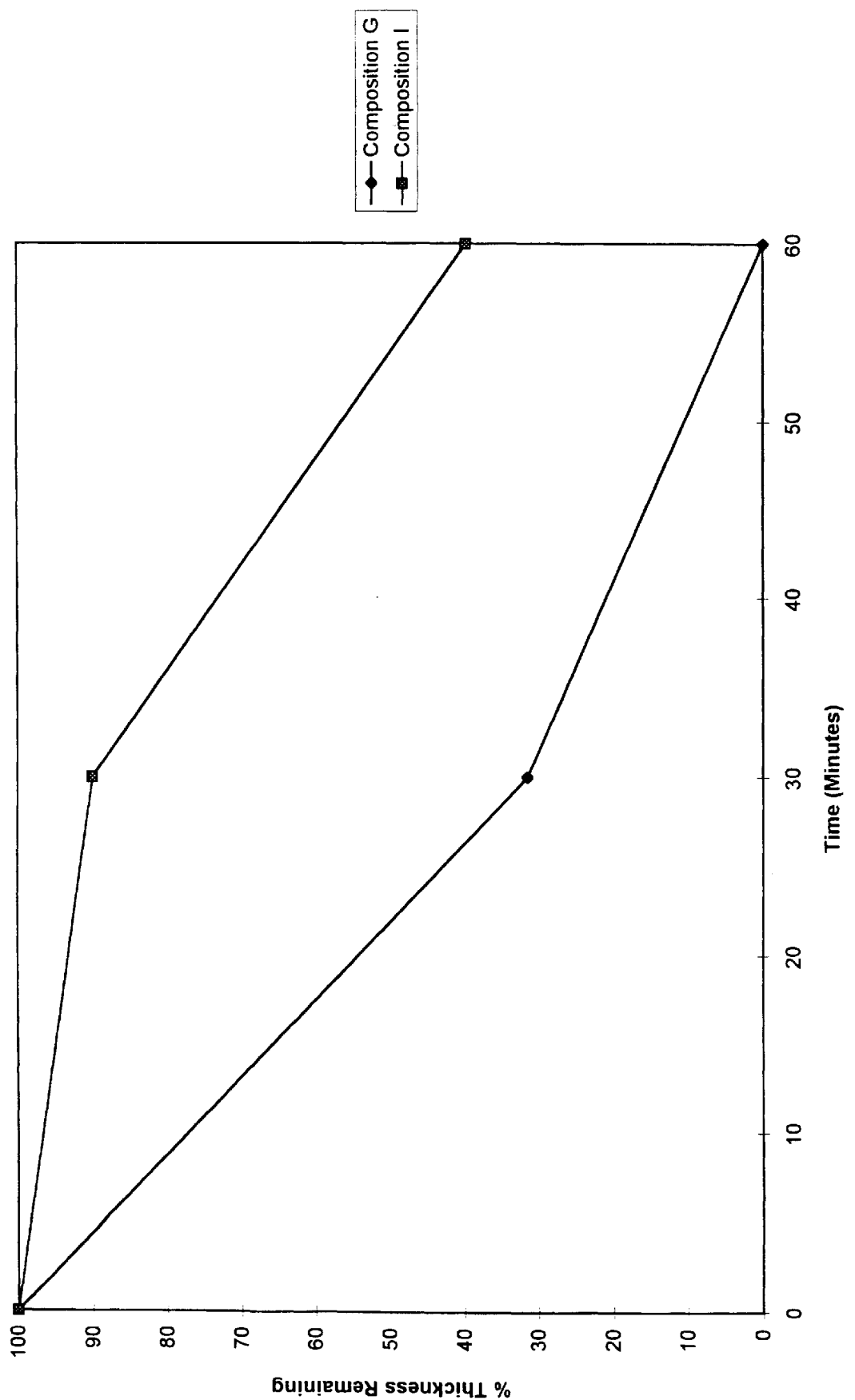
Figure 3:
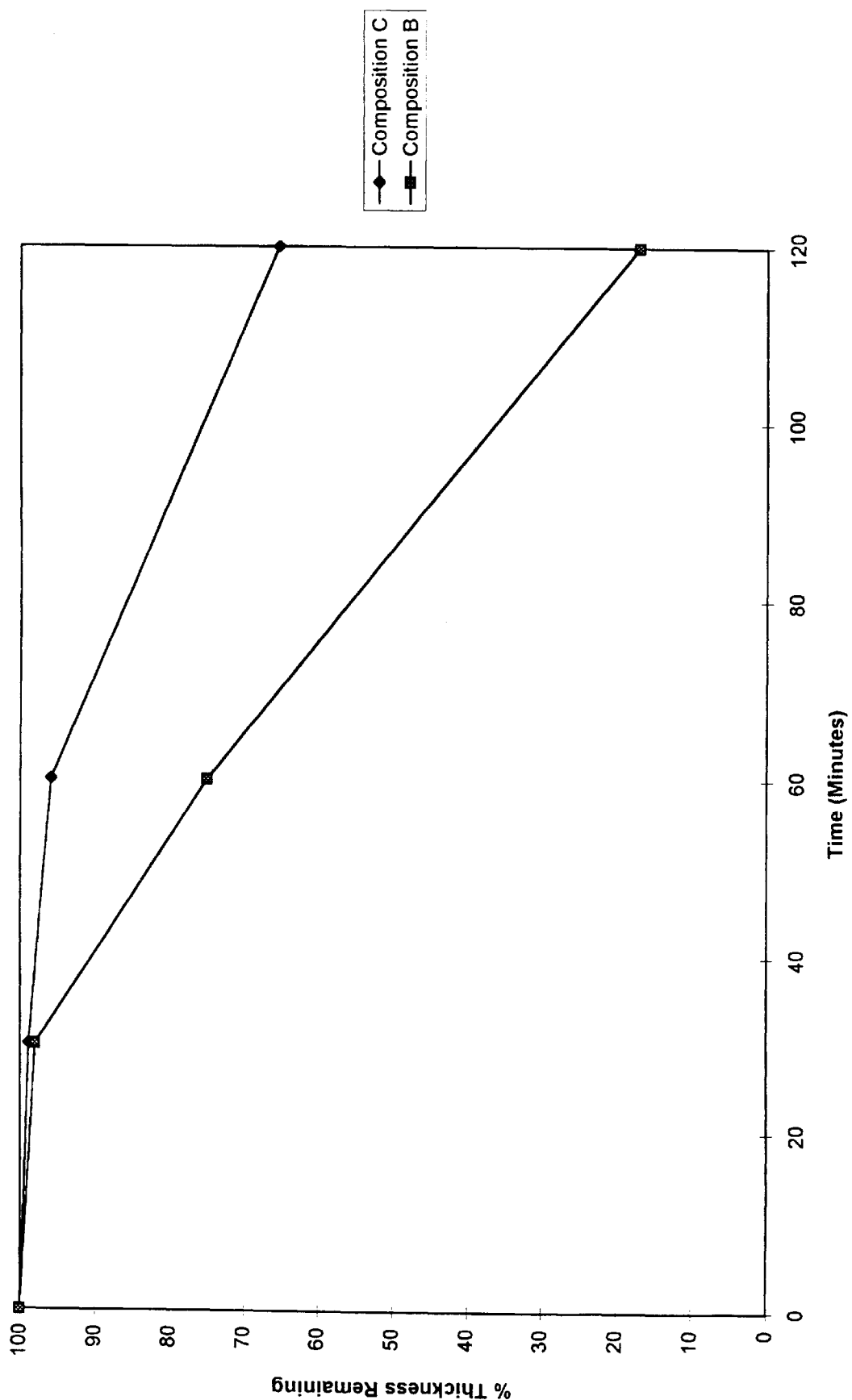
Figure 4:
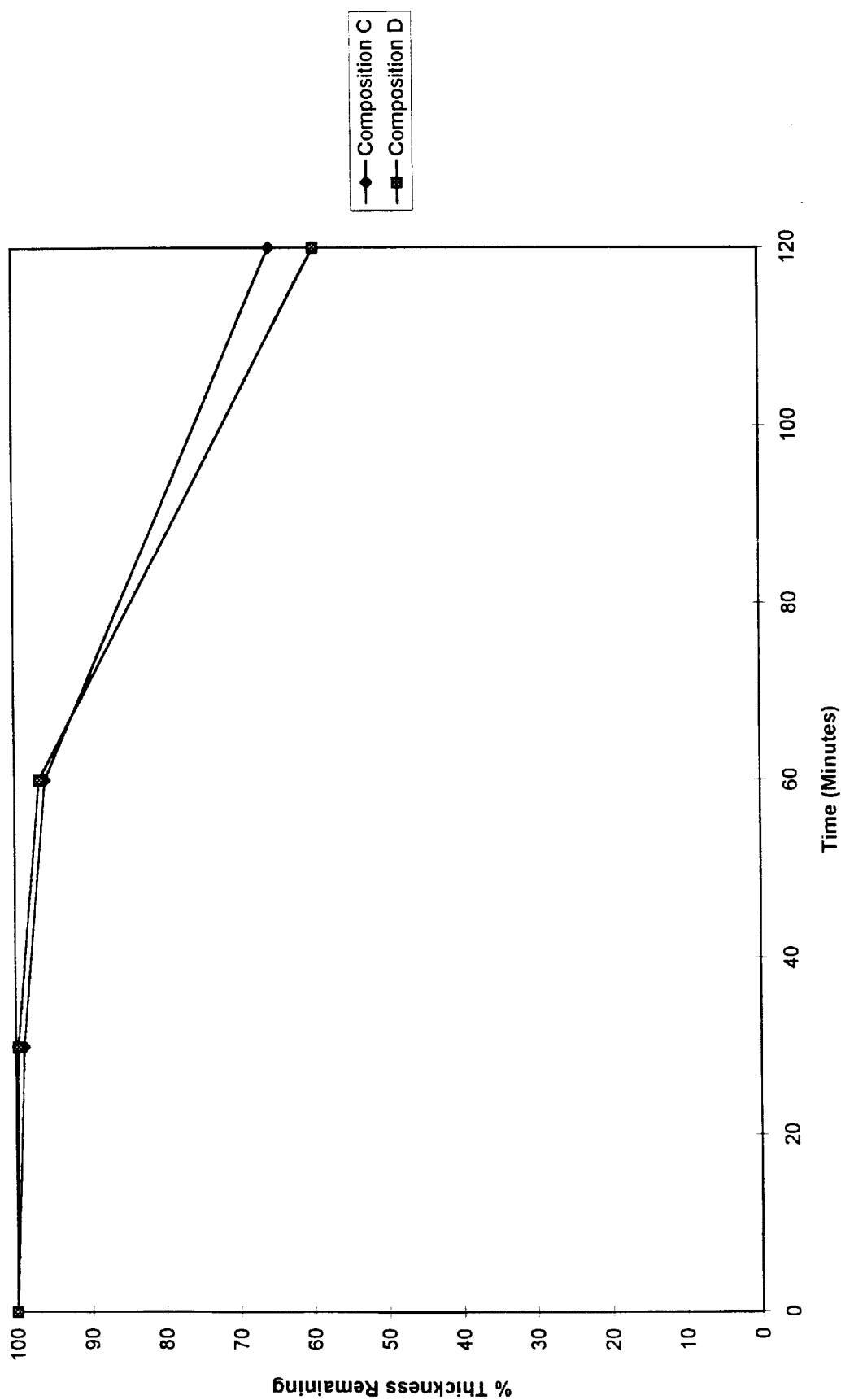

FIGS. 1–4 are graphs of the resulting measurements in the form of the percentage thickness remaining plotted against time. FIG. 1 is a comparison of compositions A and B (catechol vs. gallic acid in a monoethanolamine system). FIG. 2 is a comparison of compositions G and I (catechol vs. gallic acid in a diglycolamine system). FIG. 3 is a comparison of compositions B and C, showing the effect of gallic acid concentration in a monoethanolamine system. FIG. 4 is a comparison of compositions C and D (gallic acid in a monoethanolamine system vs. gallic acid in an isopropanolamine system).

FIG. 1 clearly shows the reduction in titanium attack obtained with stripping and cleaning composition B, containing gallic acid, compared against prior art stripping and cleaning composition A, containing catechol in otherwise identical hydroxylamine stripping and cleaning solutions.

EXAMPLE 2

Composition M was used to show that the present invention also removes mobile ion contamination from the wafer surface. Wafer samples were prepared for mobile ion contamination evaluation in the following manner. A metal film consisting of TiN/AlSi/TiN/Ti was sputter deposited on boron tetraethylorthosilicate (BTEOS) wafers. The wafers were then patterned with photoresist and the metal film etched in a plasma etch system. The photoresist was removed by oxygen plasma ashing. Contamination on the BTEOS surface is measured by an SIMS probe before and after processing in composition M for 30 minutes at 75° C. All samples were rinsed in deionized water for five cycles in a Spray rinser. The samples were then dried with a nitrogen gun. Table 2 shows the results obtained with and without the processing with composition M.

TABLE 2

|  | Na Content in solution (ppm) | Na content on BTEOS surface atoms/cm$^2$ |
| --- | --- | --- |
| Unprocessed wafer | — | $4.16 \times 10^{11}$ |
| Composition M | 9.09 | $1.18 \times 10^{11}$ |

This result shows that composition M can remove sodium from the wafer surface.

EXAMPLE 3

Figure 5A:
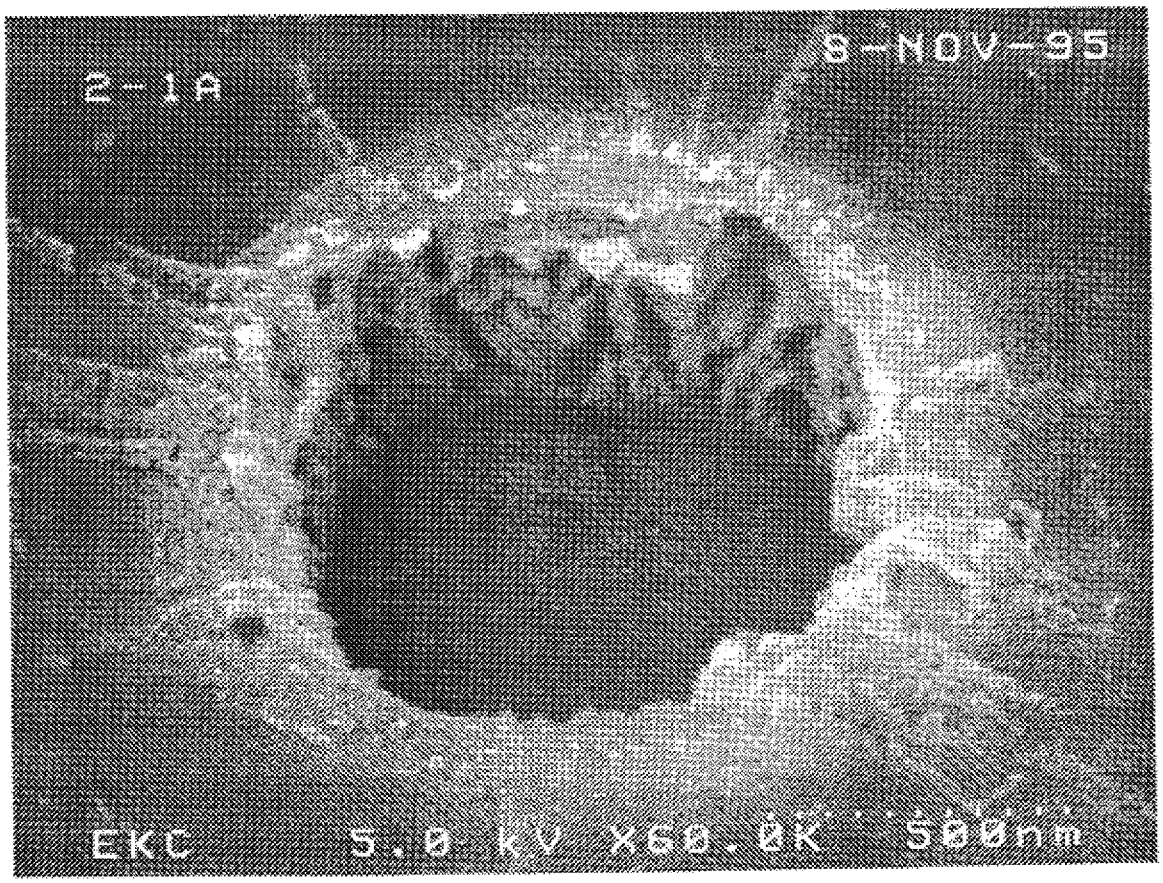
FIGS. 5A–14B are scanning electron microscope (SEM) photographs showing comparative results achieved using the composition and process of the present invention.
Figure 5B:
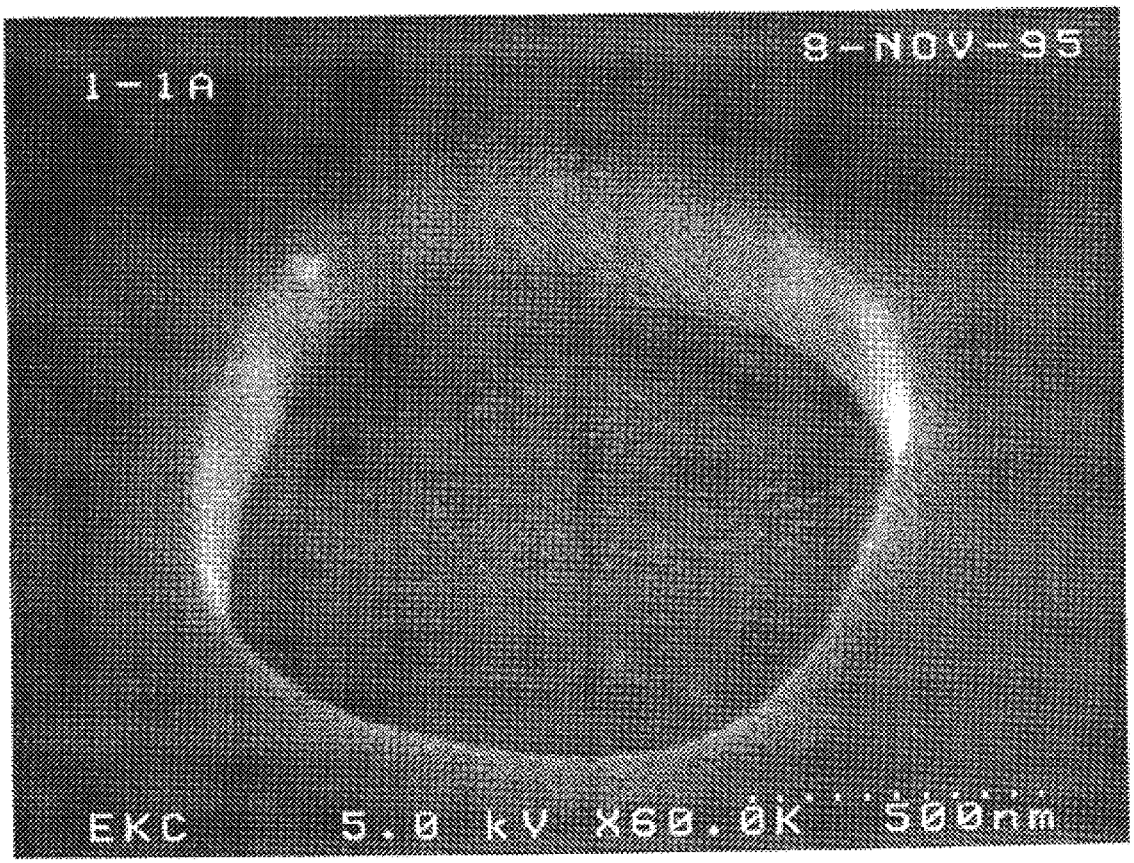

A via opening with a size of 1.2 micron in a silicon oxide dielectric layer was etched through a photoresist patterned opening using a standard silicon oxide plasma etching process. The photoresist was removed by oxygen plasma ashing. FIG. 5A is a micrograph of a scanning electron microscope (SEM) image, showing that heavy organometallic etch residue remained on the substrate surface, particularly around the via opening. The substrate was then processed in composition B for 30 minutes at 70° C. FIG. 5B, the resulting SEM photograph, shows that composition B removed all the organornetallic residue.

EXAMPLE 4

Figure 6A:
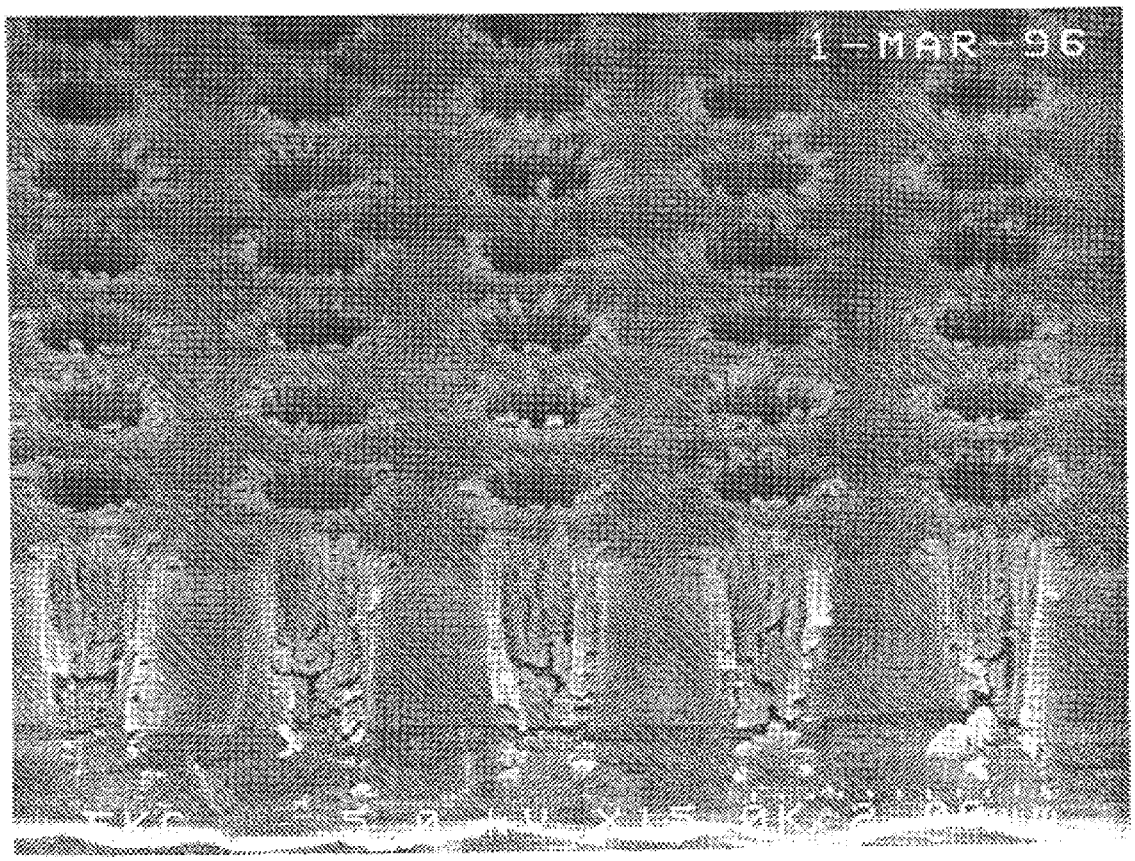
Figure 6B:
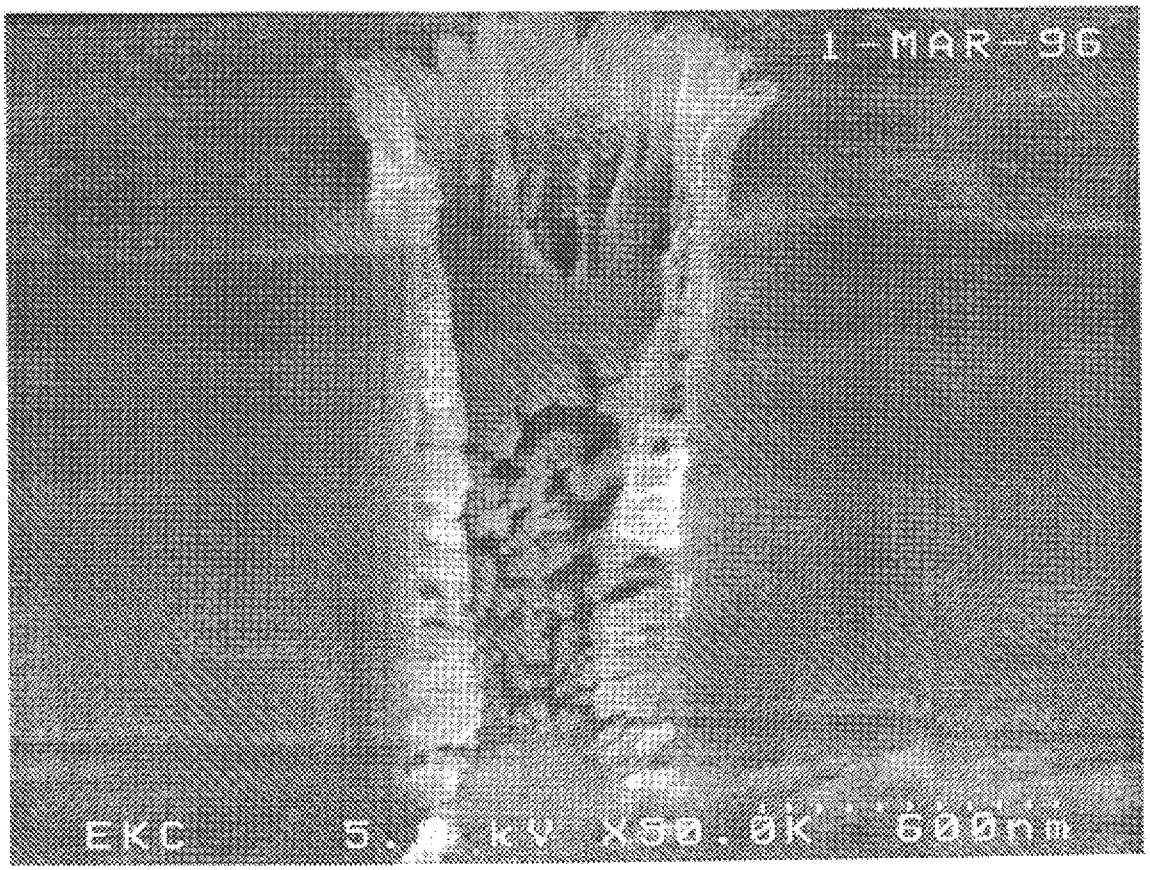
Figure 6C:
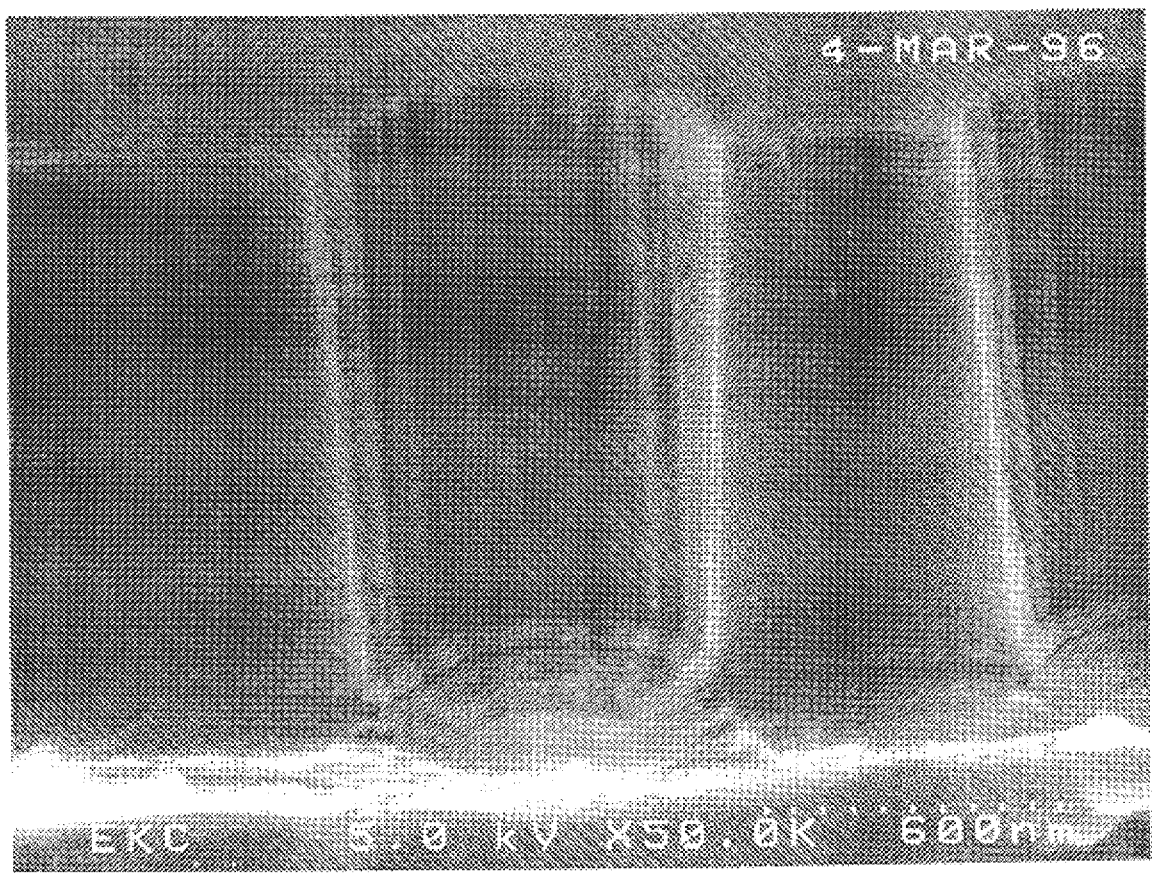
Figure 6D:
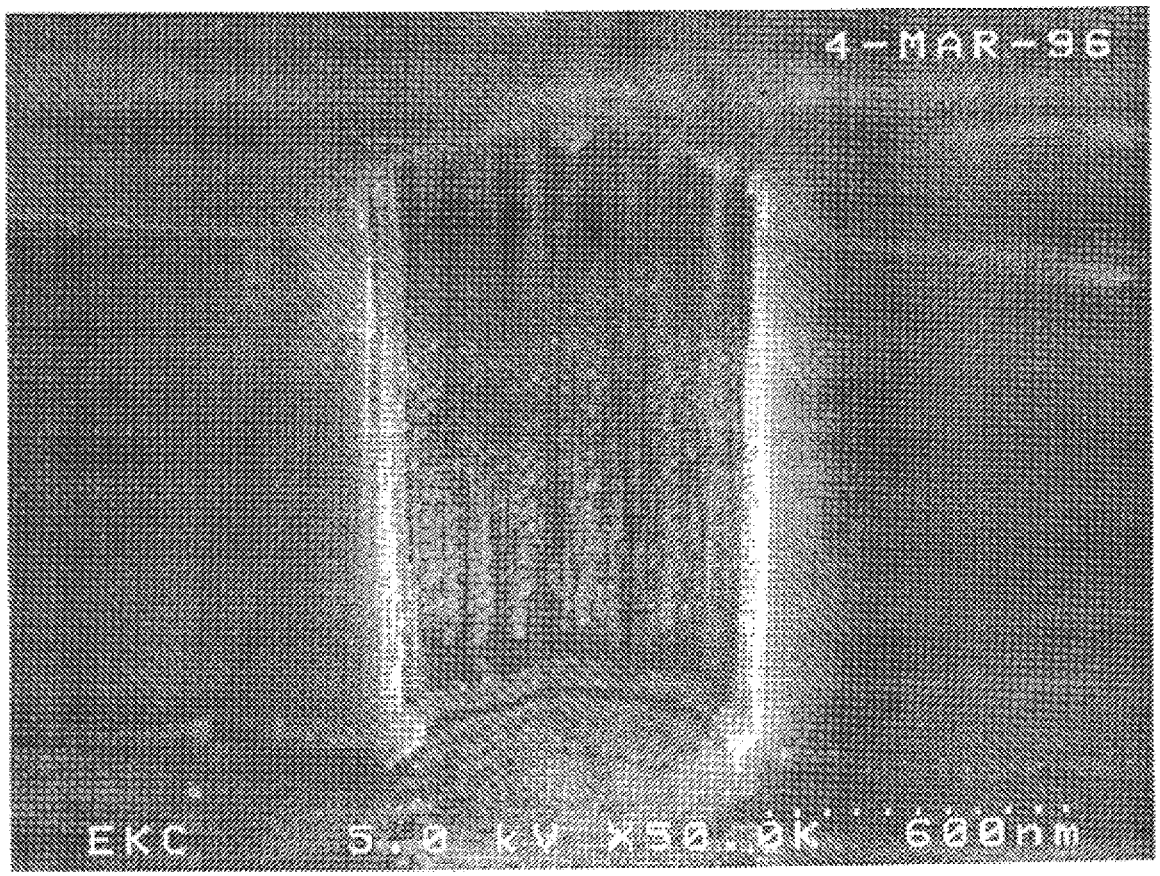

Via openings with a size of 0.6 micron in a silicon oxide dielectric layer overlying a metal film of TiN/Al—Si—Cu were etched through photoresist patterned openings using a standard silicon oxide plasma etch process. The photoresist was removed using oxygen plasma ashing. FIGS. 6A and 6B, SEM micrographs, showed that heavy etch residue remained on the via openings. The micrograph of FIG. 6C showed that composition E completely removed all the residue after processing in composition E for 30 minutes at 70° C. Composition F, a commercially available photoresist stripper containing N-ethylhydroxy-2-pyrrolidone, partially removed the etching residue after processing for 30 minutes at 120° C., as shown in FIG. 6D.

EXAMPLE 5

Figure 7A:
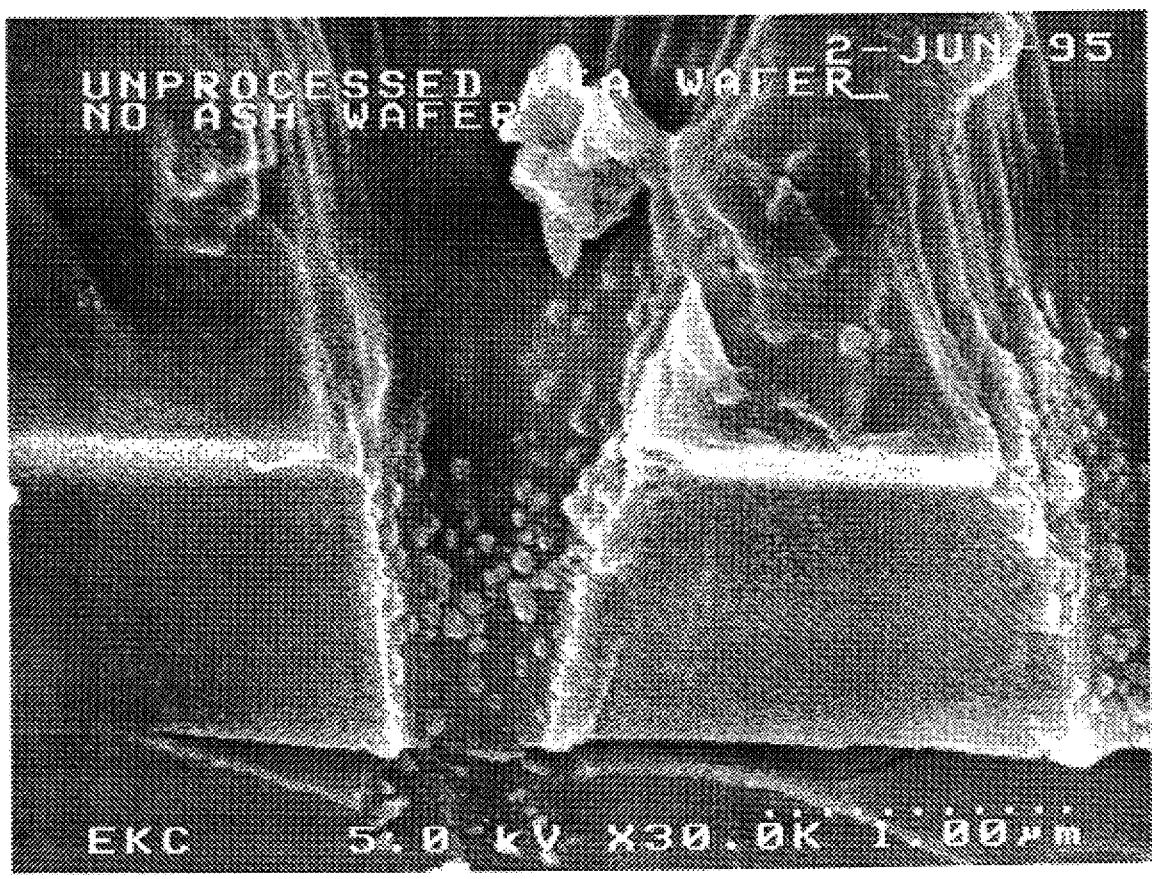
Figure 7B:
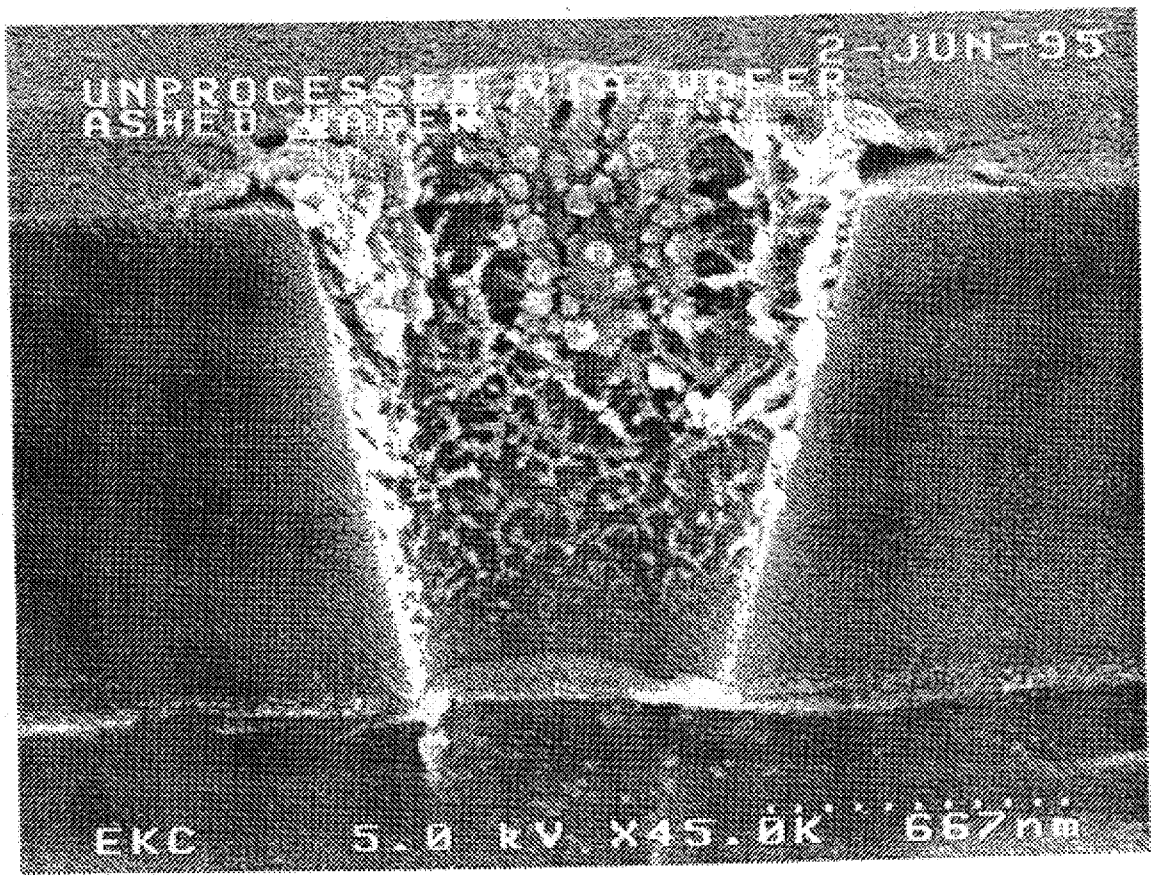
Figure 7C:
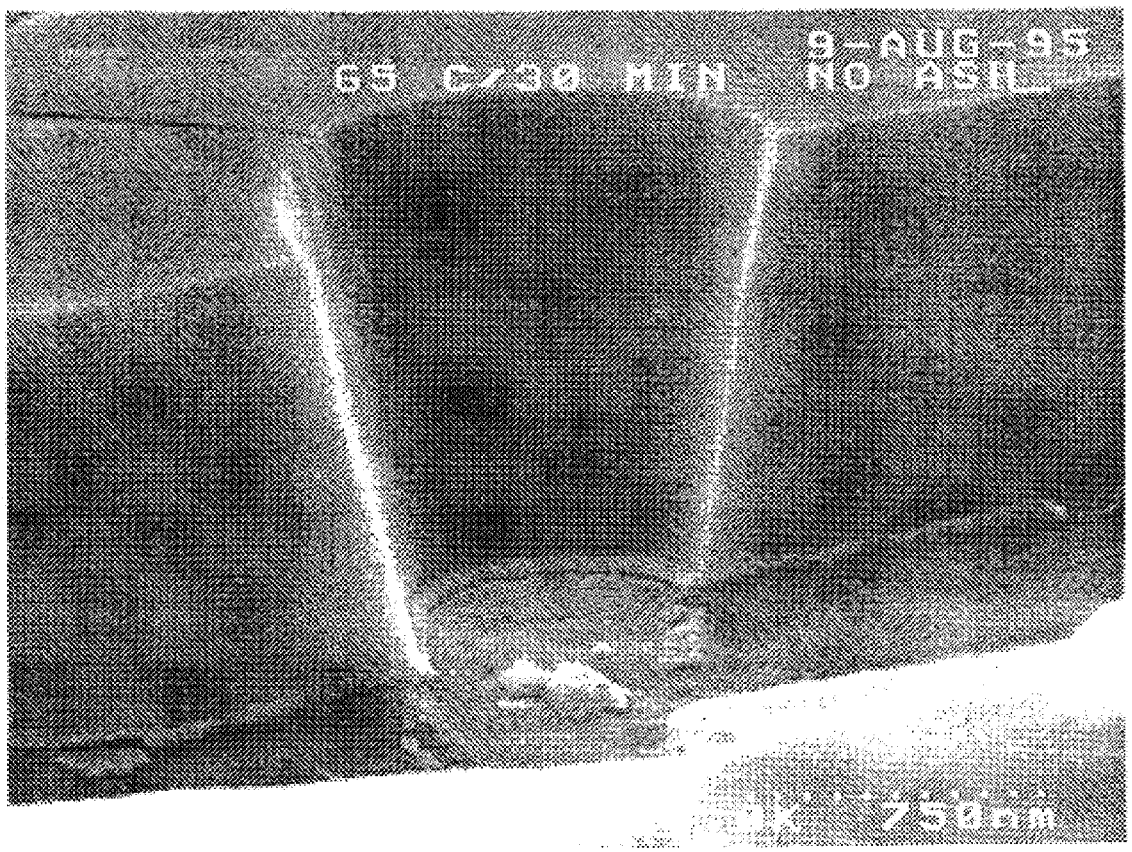
Figure 7D:
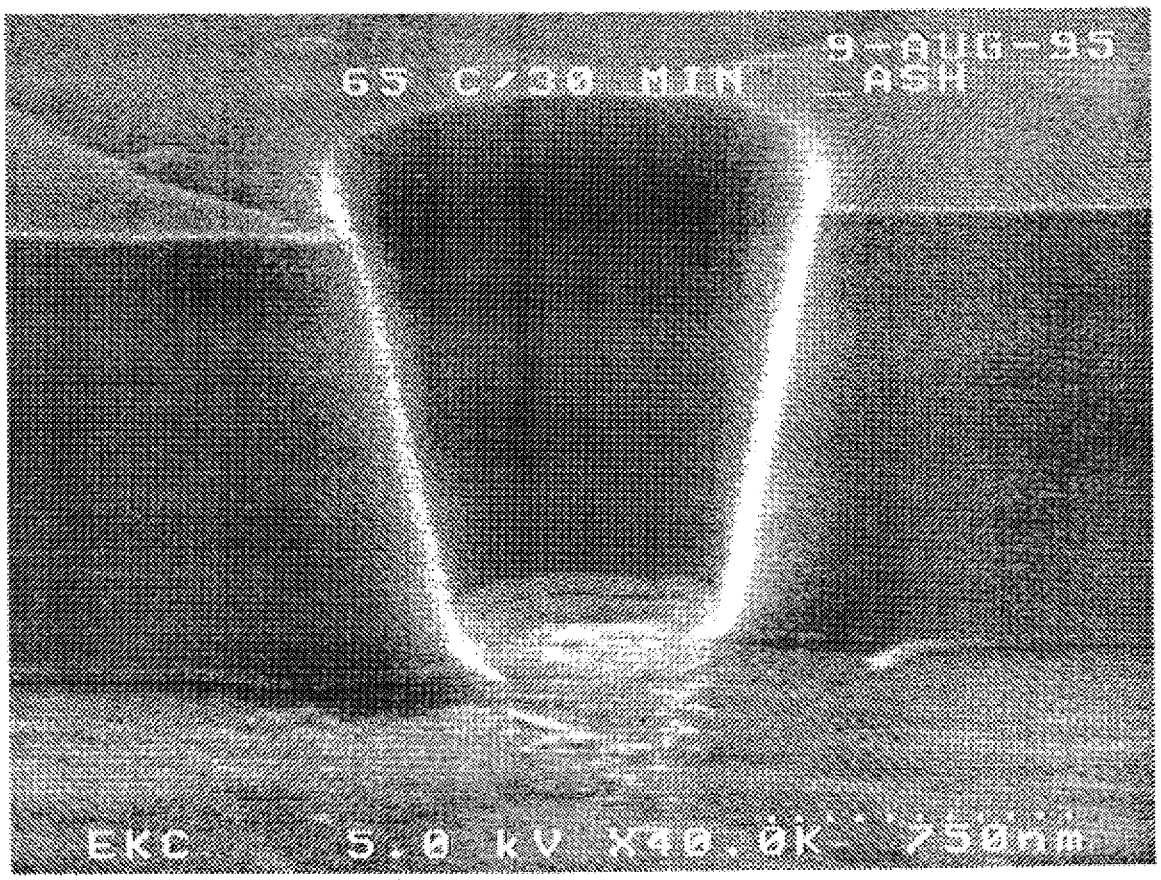

This example shows operability of a stripping and cleaning composition in which propyl gallate is substituted for catechol. Composition H was used on plasma oxide etched via wafers. Oxygen plasma ashing usually follows the plasma oxide etching process step. In this experiment, the photoresist used as a mask for the via etch was not removed by the oxygen plasma ashing step on some of the wafers in order to demonstrate that the stripping and cleaning composition can also remove plasma etch treated photoresist. FIG. 7A shows the via wafer with the photoresist layer after via etch. FIG. 7B shows organometallic and oxide residue remaining on the wafer surface after oxygen plasma ashing. FIGS. 7C and 7D show that composition H effectively removed photoresist after exposure to a plasma oxide etching environment and removed organometallic and oxide residue remaining after oxygen plasma ashing without difficulty after processing at 65° C. for 30 minutes.

EXAMPLE 6

Figure 8A:
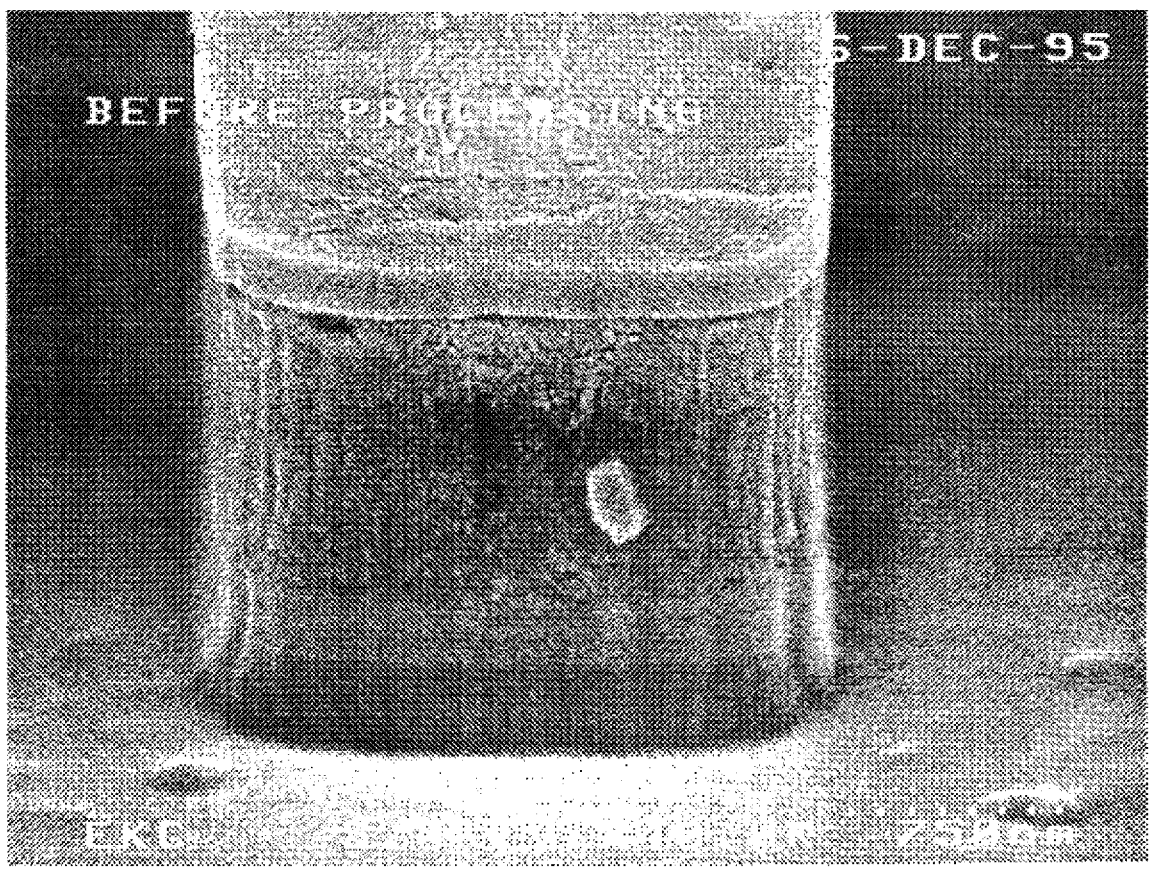
Figure 8B:
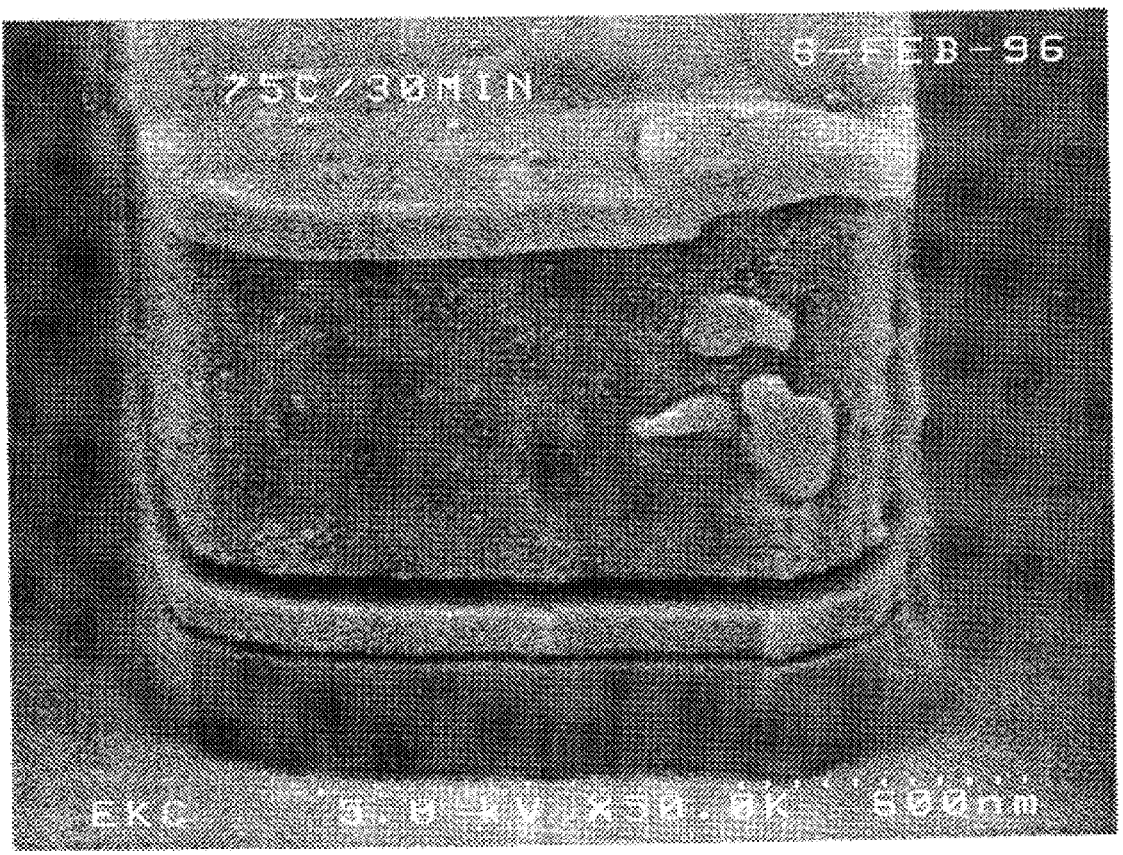
Figure 8C:
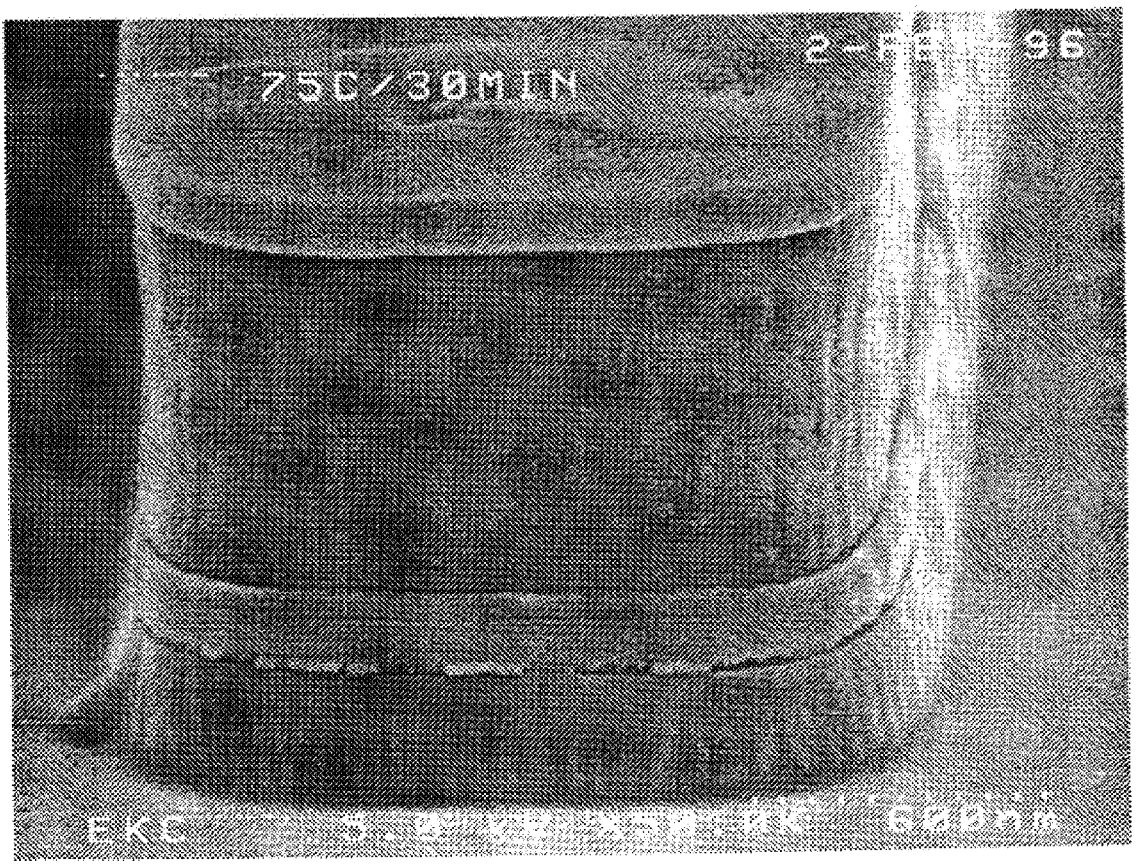

This example shows differential attack of composition G, containing catechol, and composition I, containing gallic acid. A sandwich metal thin film substrate of TiN/AlSi/Ti/TiN/Ti metallurgy was patterned and etched in a plasma metal etcher. FIG. 8A shows that there is organometallic residue left on the metal line surface after photoresist removal by oxygen plasma ashing. The titanium barrier layer (Ti/TiN/Ti) was undercut after the wafer was exposed to composition G at 75° C. for 30 minutes, as shown in FIG. 8B. Under the same process conditions, stripper composition I, containing gallic acid, did not attack the barrier layer, as shown in FIG. 8C.

EXAMPLE 7

Figure 9A:
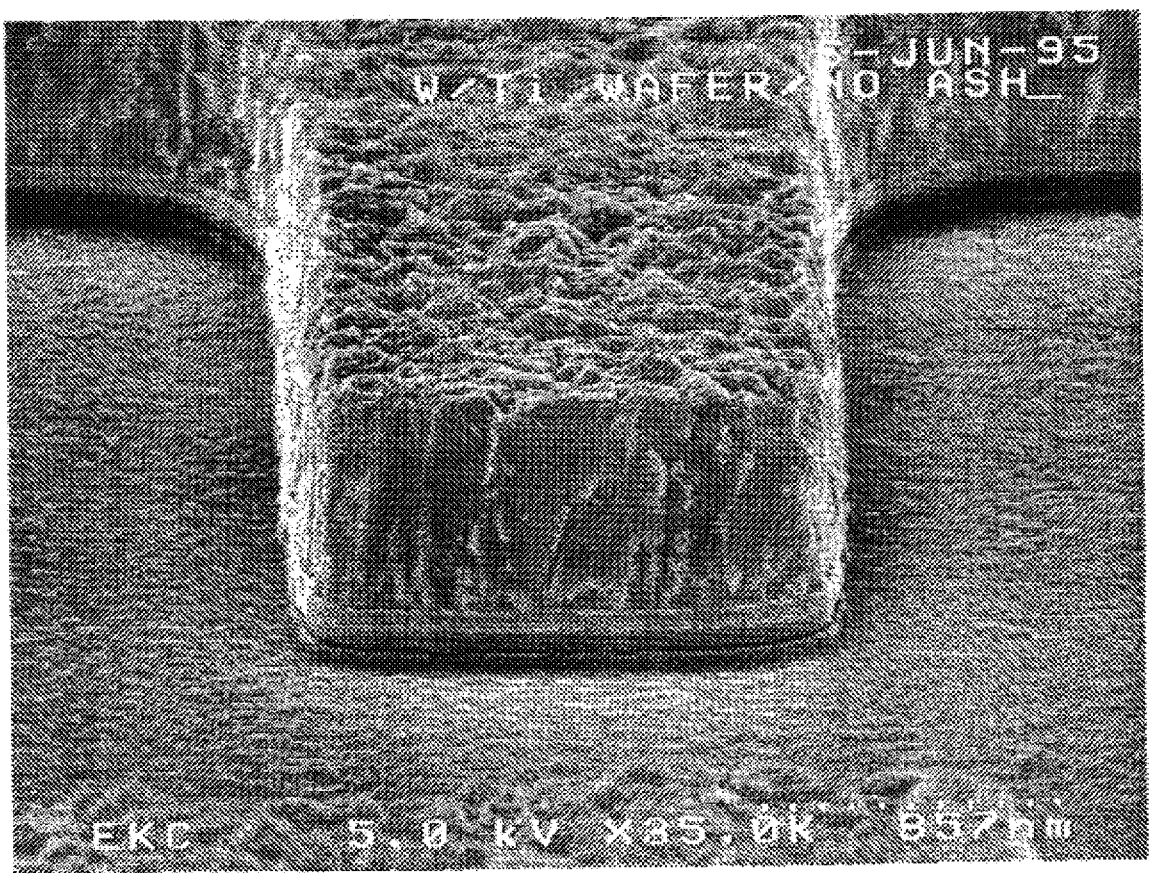
Figure 9B:
Figure 9C:
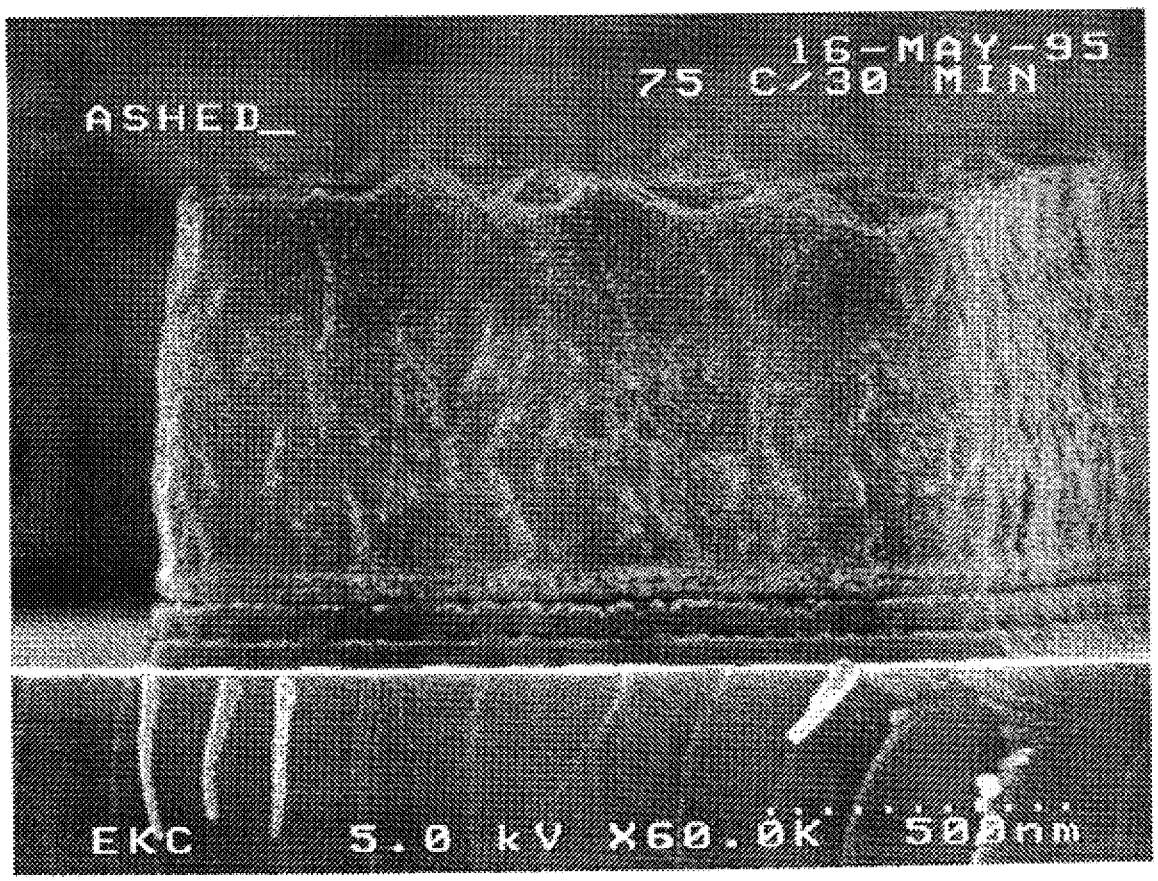

This example further illustrates the reduction of attack on a titanium barrier metal film by a stripping and cleaning composition containing gallic acid. The test was carried out on a plasma metal etched wafer with a W/Ti metallurgy. Photoresist was removed by oxygen plasma ashing. The wafer was immersed into the stripping and cleaning solution at 75° C. for 30 minutes. The titanium barrier layer was severely laterally attacked by composition G, containing catechol, as shown in FIG. 9A. Stripping and cleaning composition I, containing gallic acid, did not have any impact on the titanium film, as shown in FIG. 9B.

EXAMPLE 8

Figure 10A:
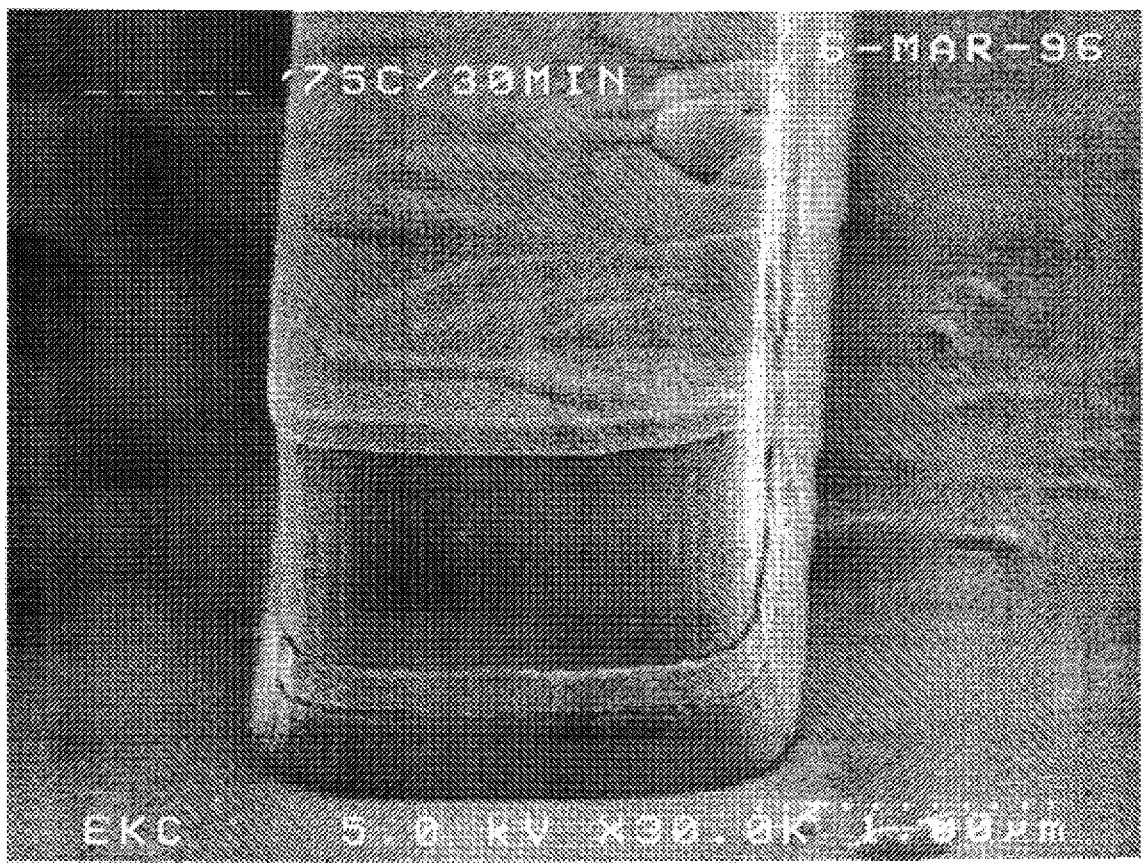
Figure 10B:
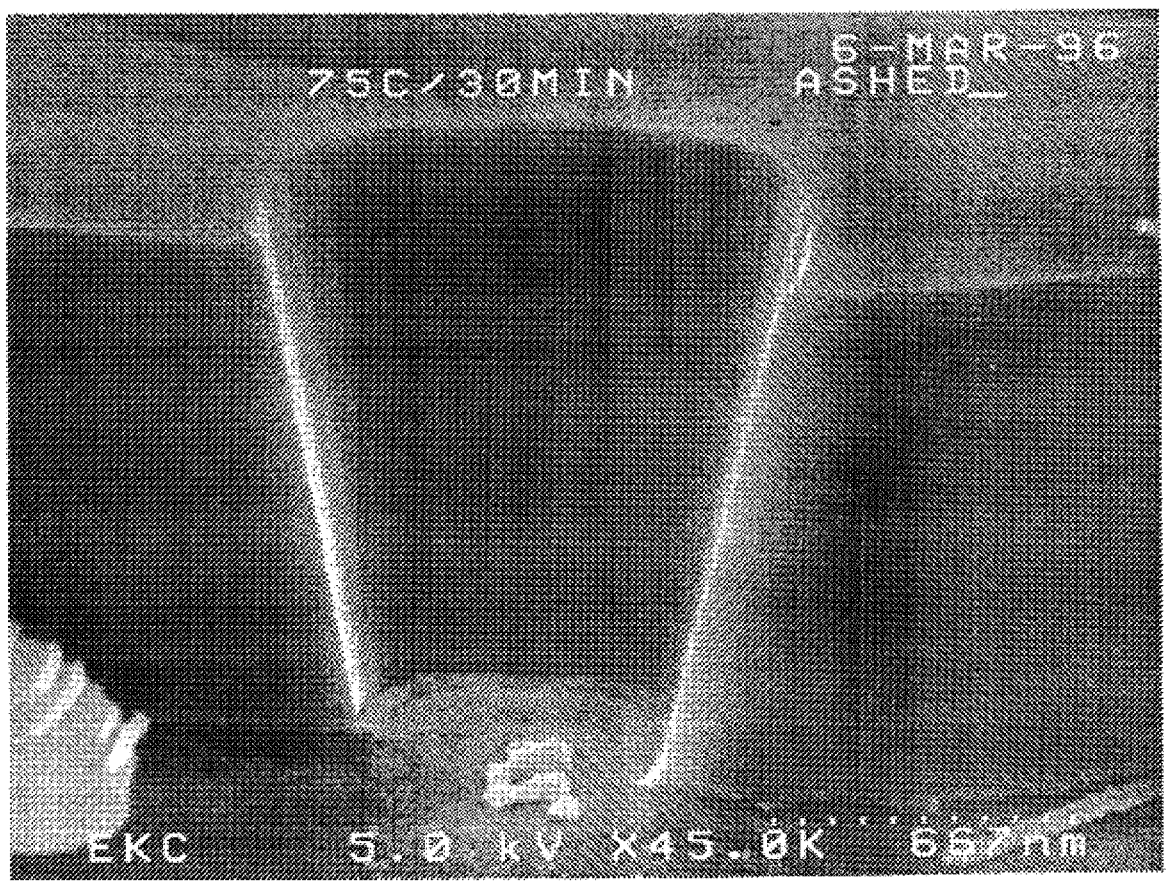

This example shows that additional polar solvent can be added to the hydroxylamine/gallic acid stripping and cleaning composition without impairing its performance. FIGS. 10A and 10B show the result of plasma etched metal and via wafers which have been processed in composition J for 30 minutes at 75° C. Composition J removed all the etching residues without attacking the titanium barrier metal layer.

EXAMPLE 9

Figure 11A:
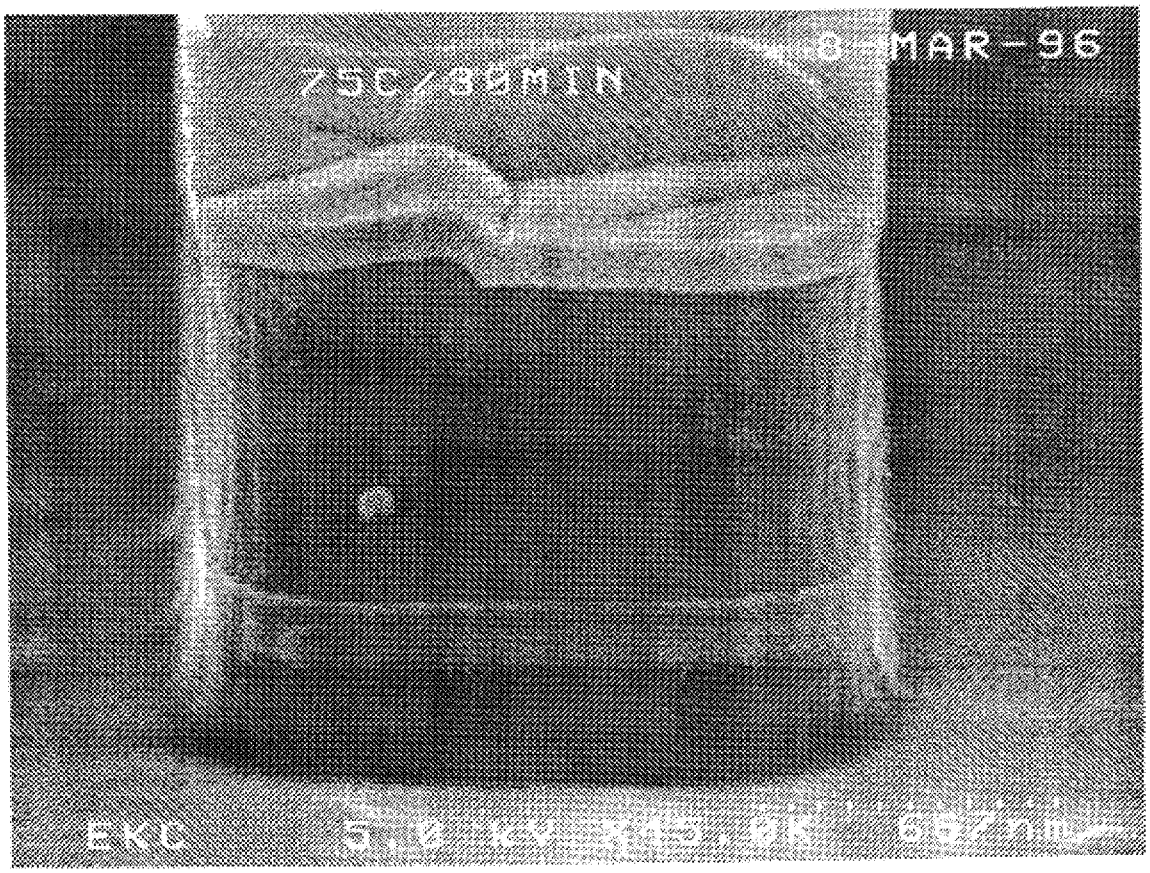
Figure 11B:
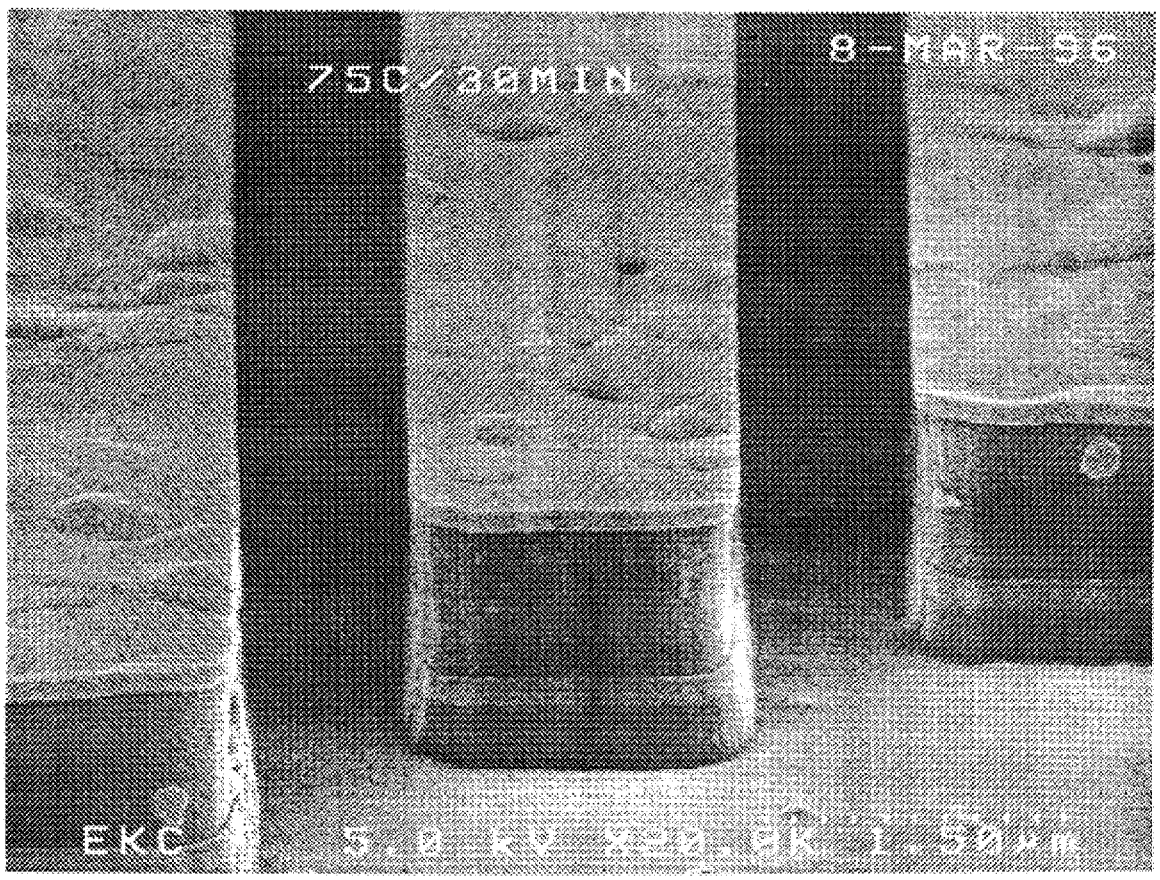
Figure 11C:
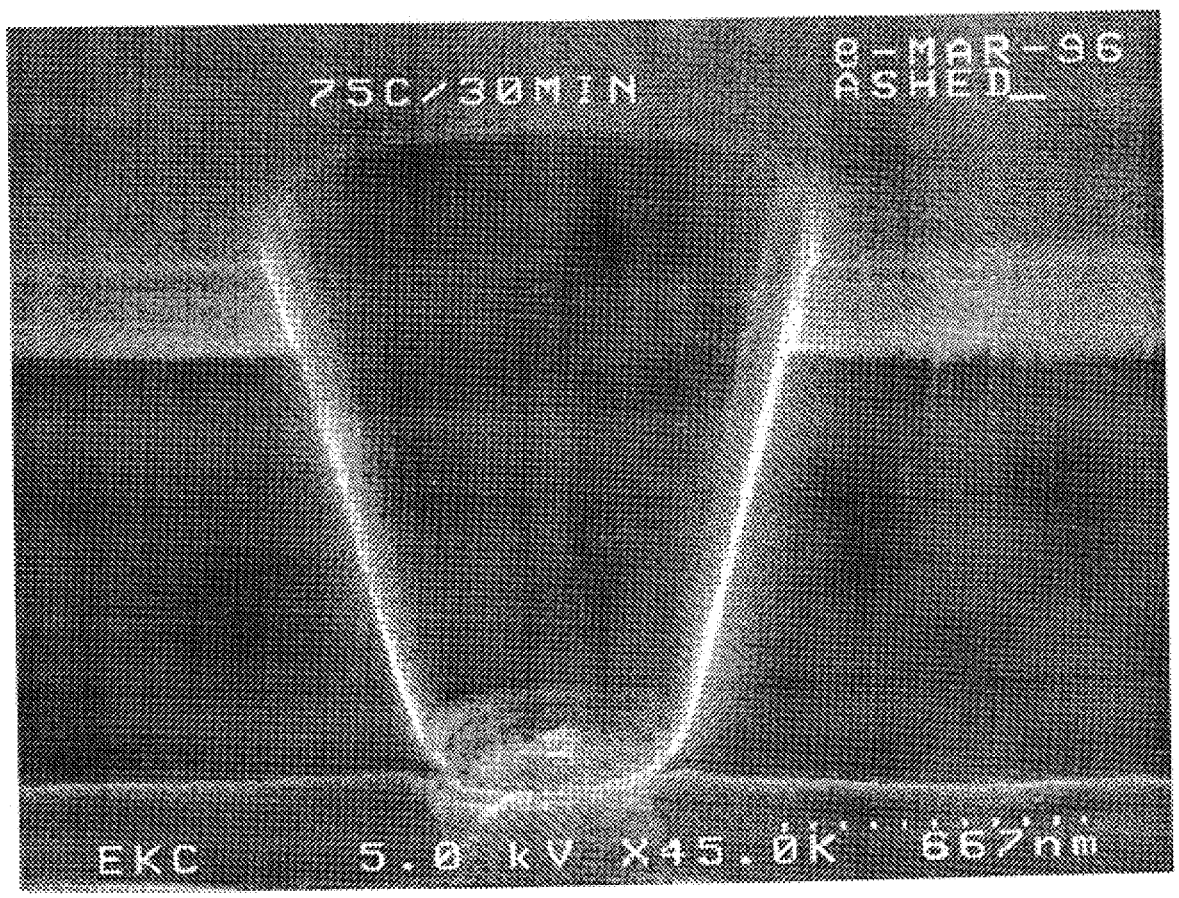

This example demonstrates that composition K, a hydroxylamine/gallic acid stripping and cleaning composition using isopropanolamine as an alcohol amine, removed all etching residues without attacking the titanium barrier metal layer. FIGS. 11A, 11B and 11C show the result of plasma etched metal and via wafers which have been processed in composition K for 30 minutes at 75° C.

EXAMPLE 10

This example shows that a hydroxylamine stripping and cleaning composition containing gallic acid is able to remove post etch photoresist residues from a polysilicon substrate. Silicon wafers having an etched polysilicon layer with a thickness of about 400 nm were immersed in composition I at 95° C. for 30, 45 and 60 minutes. The wafers were then dried by a dry nitrogen gun. The wafers were then examined by an Hitachi S-4500 FE Scanning Electron Microscope (SEM) to evaluate the capability of composition B to remove etching residues.

Figure 12A:
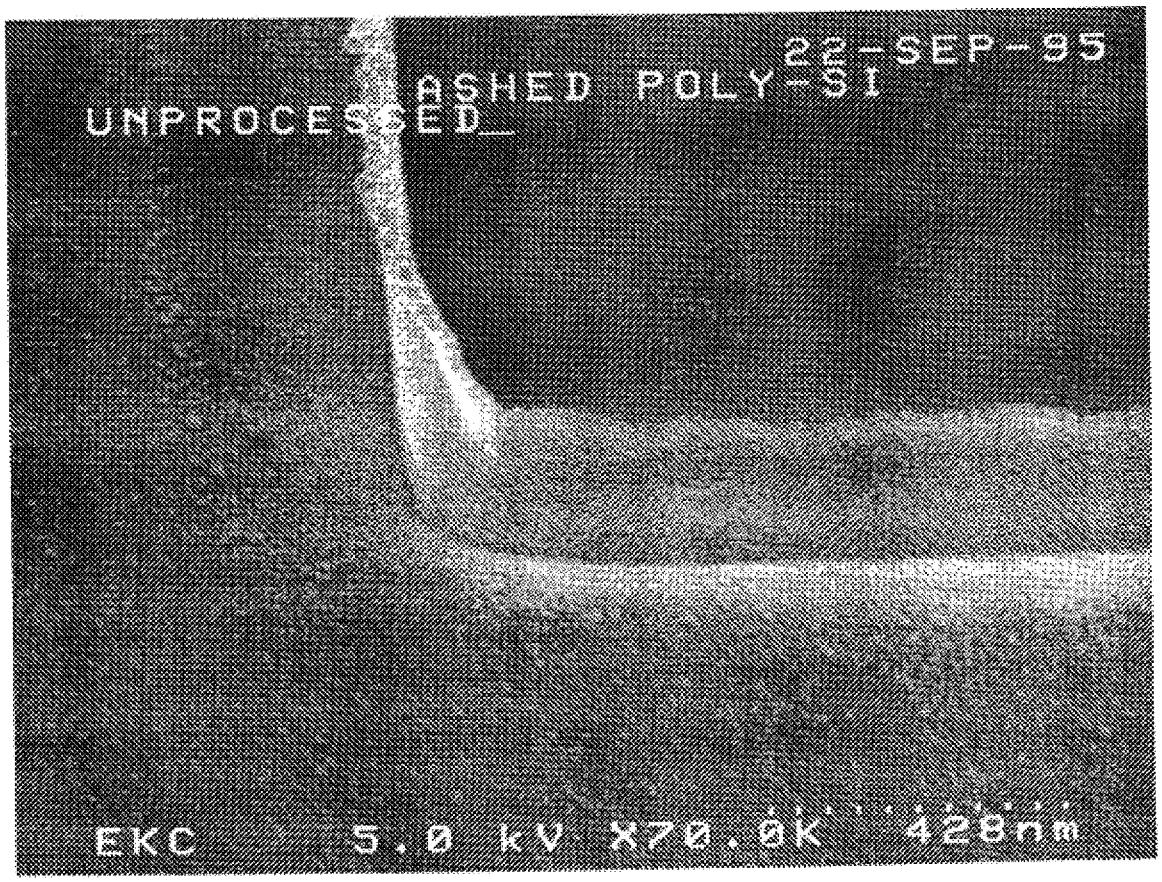
Figure 12B:
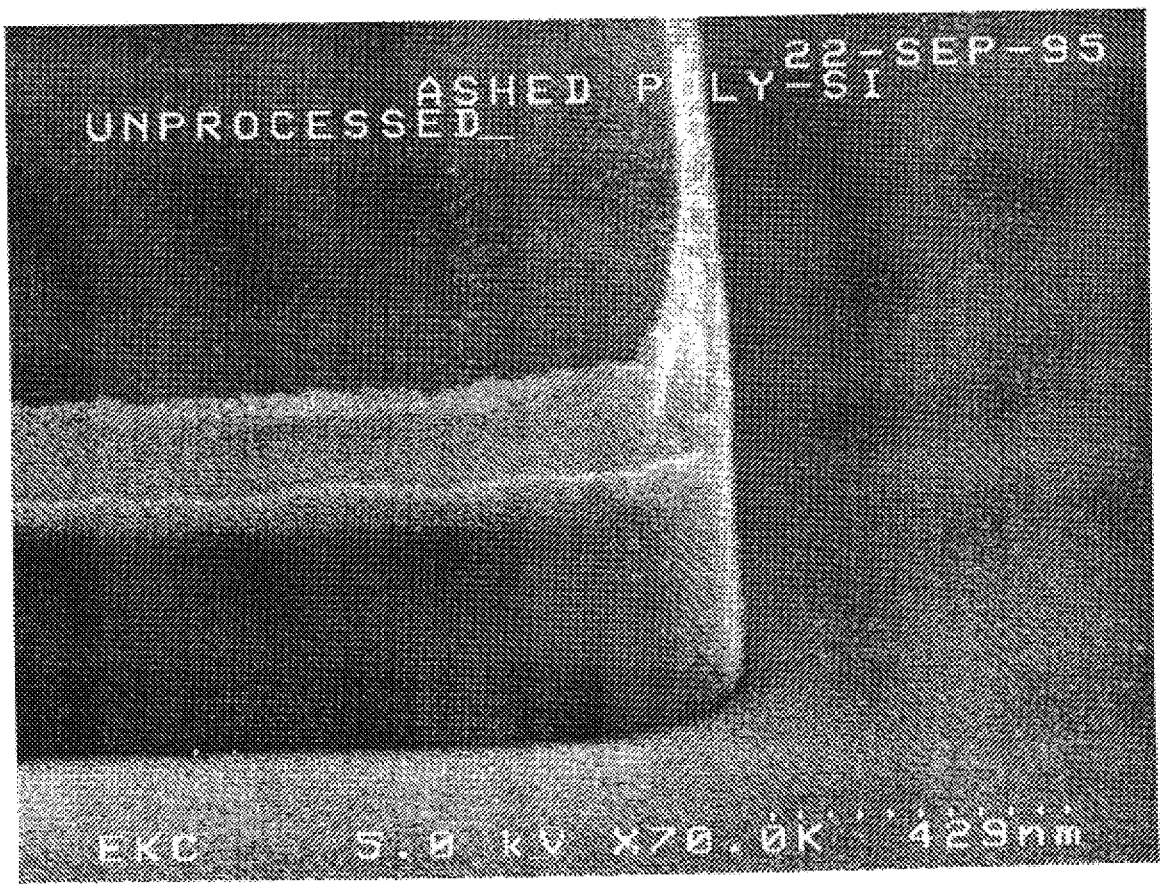
Figure 12C:
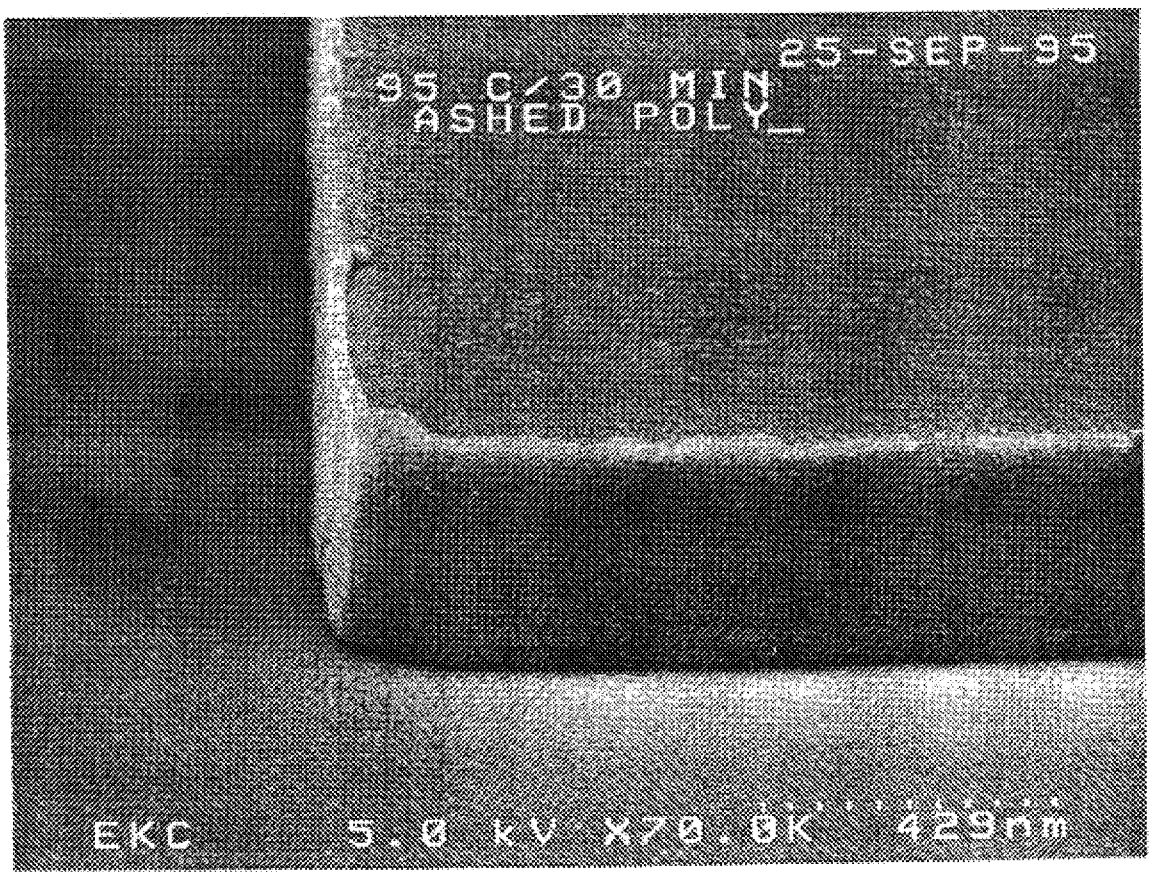
Figure 12D:
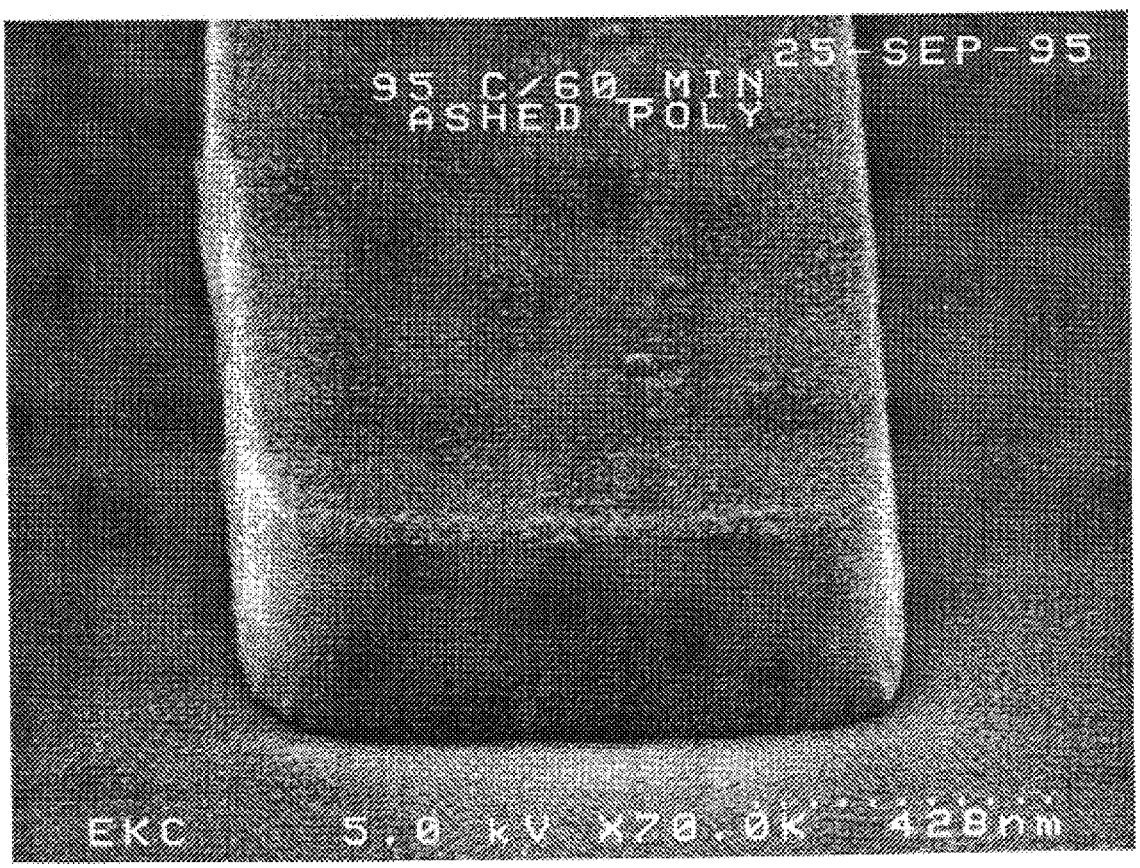
Figure 12E:
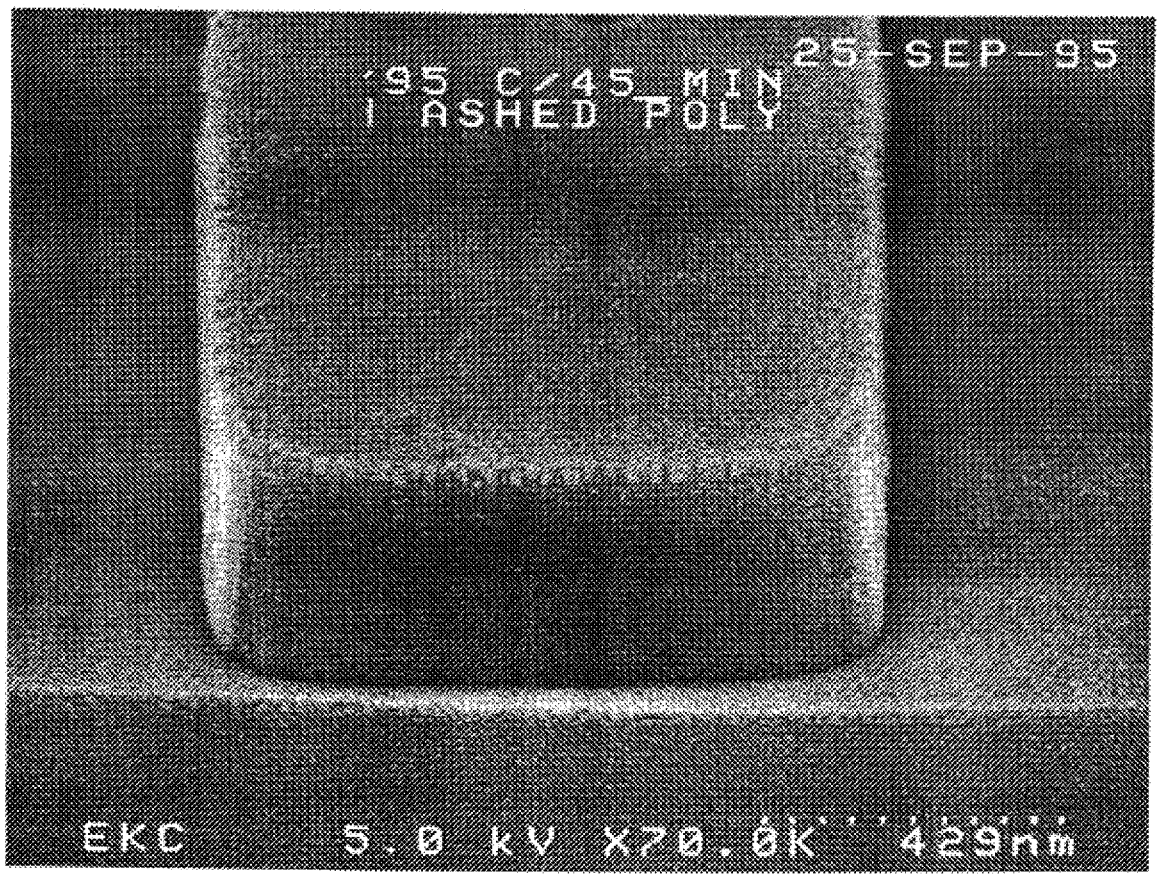

SEM photographs of the unprocessed and processed wafers are shown in FIGS. 12A, 12B, 12C, 12D and 12E. Most of the residues are on the sidewalls of the polysilicon lines, as shown in FIGS. 12A and 12B. After immersion in composition I for 30 and 45 minutes, most of the residues are removed, as shown in FIGS. 12C and 12D. The residues are completely removed after immersion in composition I for 60 minutes, as shown in FIG. 12E, which is an acceptable process condition for wafer fabrication.

EXAMPLE 11

Figure 13A:
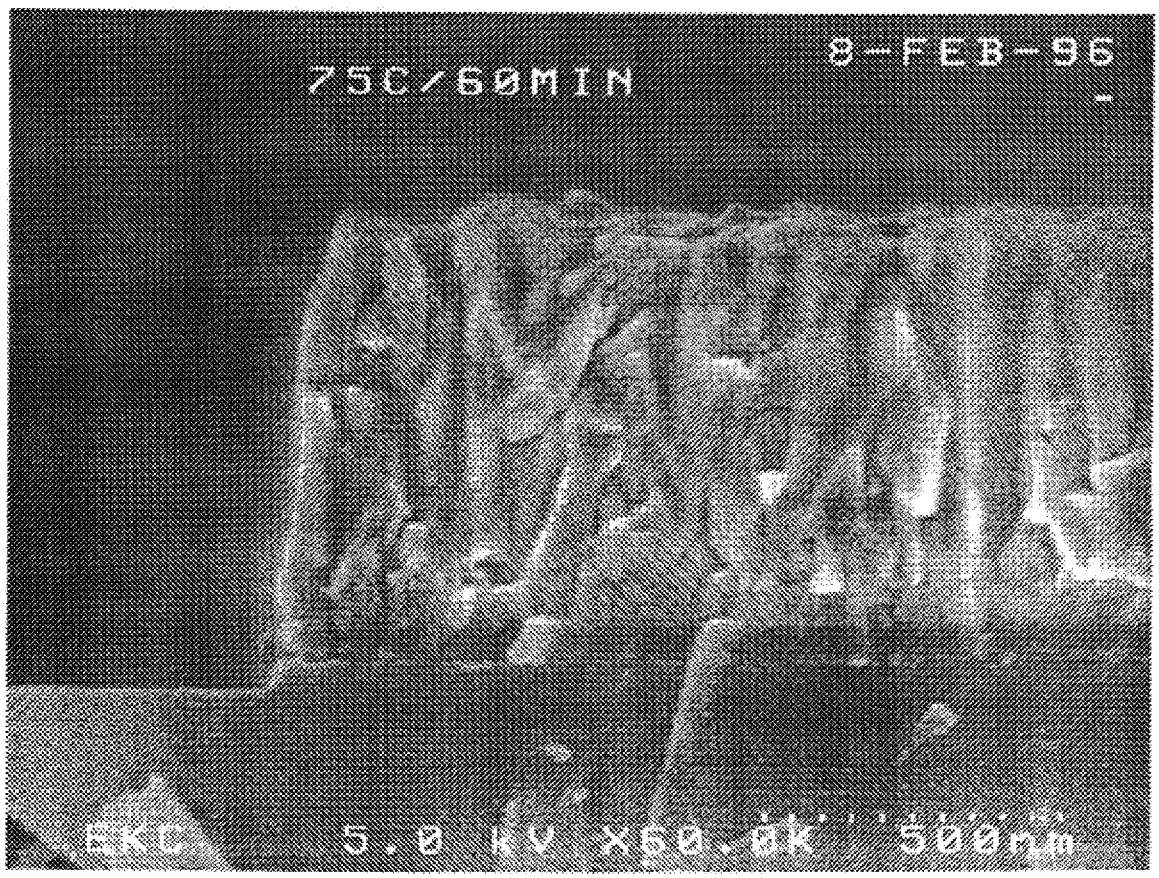
Figure 13B:
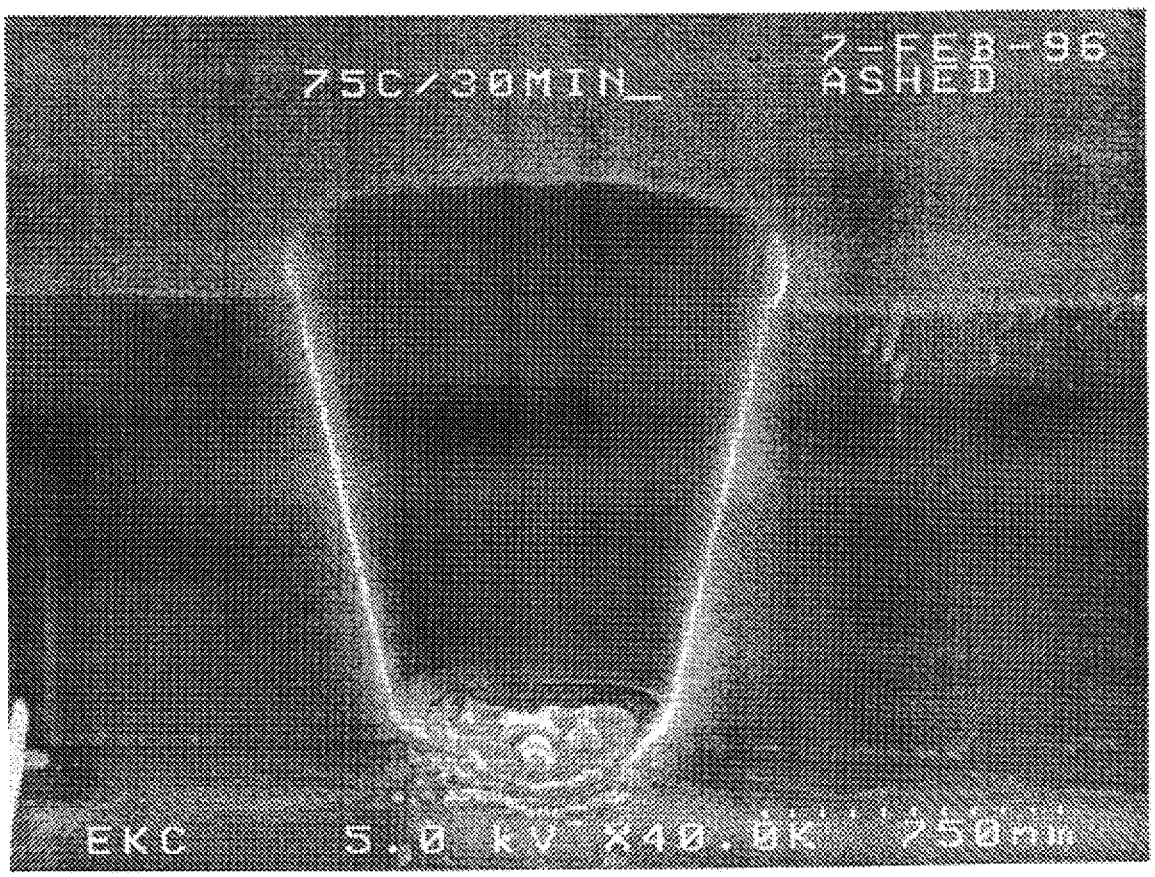

This example shows that gallic acid performs equally well with a mixture of alcohol amines. Composition K is a solution containing monoethanolamine and diglycolamine. FIGS. 13A and 13B show its effectiveness in removing residue without attacking a titanium barrier metal layer in metal and via etch wafers after treatment with composition K at 75° C. for 30 minutes and 60 minutes.

EXAMPLE 12

Figure 14A:
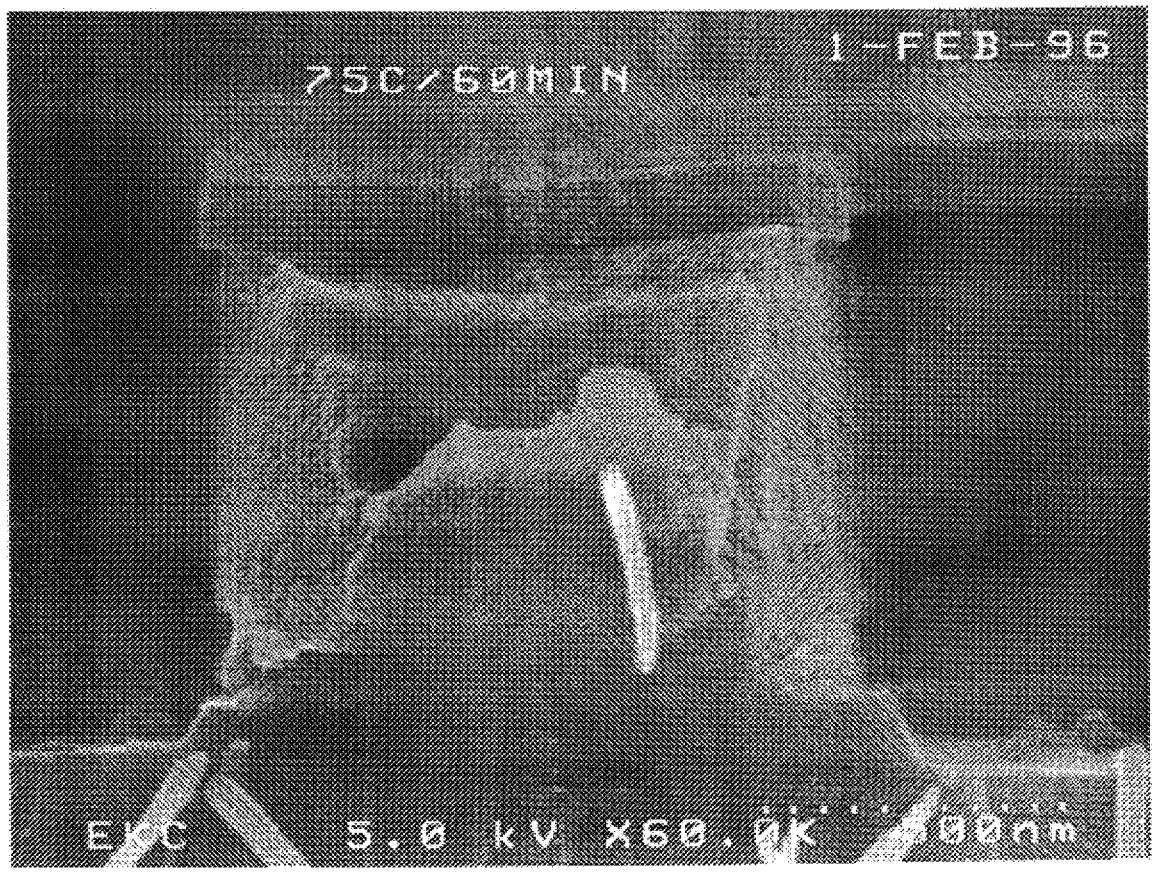
Figure 14B:
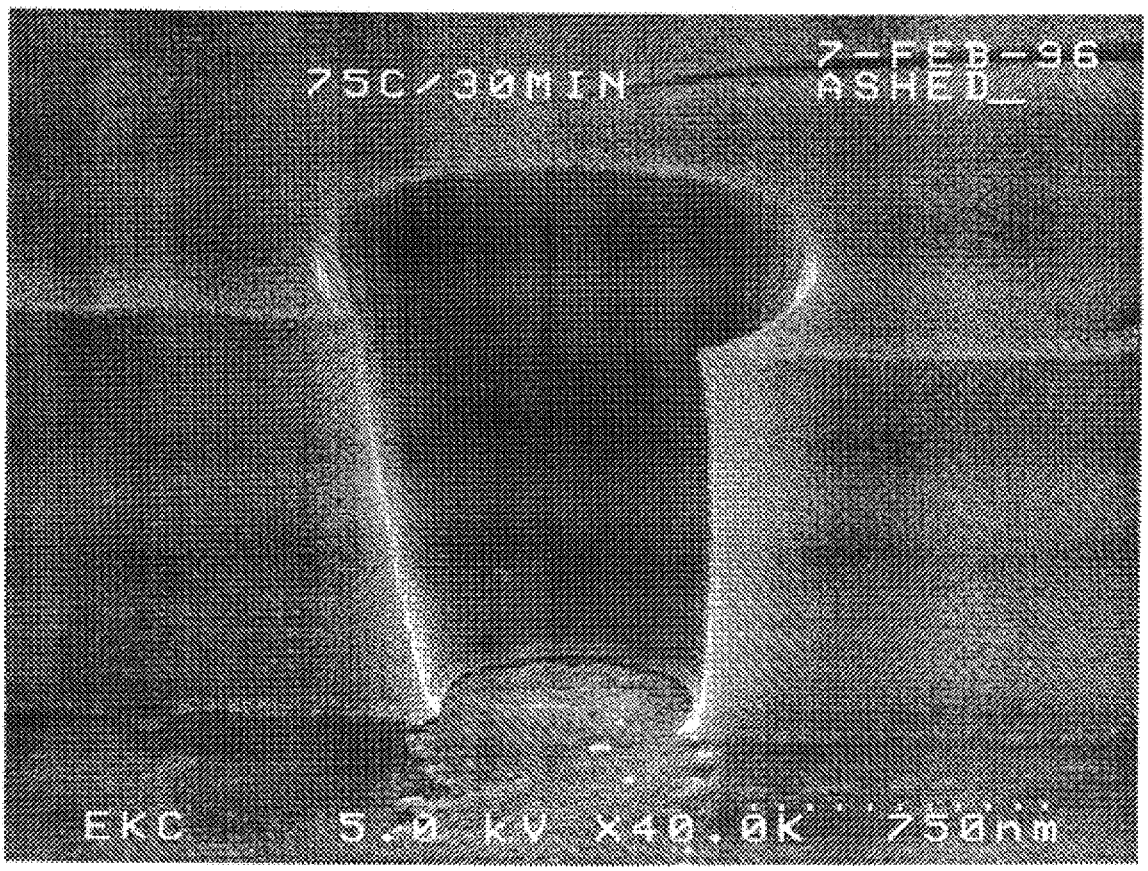

Composition L, in which the alcohol amine is isopropanolamine, effectively removed all etching residue after metal and via etch without attacking a Ti barrier metal layer when used for processing at 75° C. for 60 minutes, as shown in FIG. 14A. FIG. 14B demonstrates its effectiveness in cleaning via etch residues from a via opening.

In summary, the above examples show that compositions B–E and H–L have the capability to remove photoresist and etching residues on various wafers, such as metal, via and polysilicon wafers, without adverse effects on the substrates. These compositions exhibit superior performance in substrate compatibility, especially with Ti and Al metal films at high temperature, in comparison to compositions A, F and G. Compositions B–E and H–L contain no substances which are subject to the reporting requirements of Section 313 of the Emergency Planning and Community Right-To-Know Act of 1986 and of 40 CFR 372, unlike compositions A and G.

It should now be readily apparent to those skilled in the art that a novel composition and process capable of achieving the stated objects of the invention has been provided. The improved hydroxylamine based composition and process using such a composition of this invention is suitable for meeting current semiconductor fabrication requirements. The composition and process is suitable for removing photoresist and other polymeric materials and residues from wafers and other substrates including one or more titanium metal layers without substantial attack on such titanium layers. The composition and process does not contain or use any material subject to reporting requirements.

It should further be apparent to those skilled in the art that various changes in form and details of the invention as shown and described may be made. It is intended that such changes be included within the spirit and scope of the claims appended hereto.

What is claimed is:

1. An aqueous composition for removing polymeric material or a photoresist residue from a substrate comprising about 5 percent to about 35 percent by weight of hydroxylamine, about 10 percent to about 80 percent by weight of at least one alkanolamine compound which is miscible with the hydroxylamine, and from about 5 percent to about 30 percent by weight of gallic acid.

2. The composition of claim 1 wherein said at least one alkanolamine is a monoamine, diamine or triamine with an alcohol group having from 1 to 5 carbon atoms.

3. The composition of claim 1 wherein said at least one alkanolamine has the formula:

$$R_1R_2-N-CH_2CH_2-O-R_3,$$

wherein $R_1$ and $R_2$ are, independently in each case, H, $CH_3$, $CH_3CH_2$ OR $CH_2CH_2OH$ and $R_3$ is $CH_2CH_2OH$.

4. The composition of claim 1 wherein said at least one alkanolamine is monoethanolamine, diethanolamine, triethanolamine, tertiarybutyldiethanolamine, isopropanolamine, 2-amino-2-ethoxvethanol, or 2-amino-2-ethoxypropanol.

5. The composition of claim 1 in which said composition comprises from about 10 to 35 percent by weight of hydroxylamine and from about 10 to about 45 by weight of at least one alkanolamine.

\* \* \* \* \*